US012794452B2

(12) United States Patent
Park et al.

(10) Patent No.: US 12,794,452 B2
(45) Date of Patent: Nov. 10, 2026

(54) OSCILLATOR WITH LEAKAGE CURRENT COMPENSATION FUNCTION

(71) Applicant: SK hynix Inc., Icheon-si (KR)

(72) Inventors: Jeong Pyo Park, Icheon-si (KR); Jae Woo Song, Icheon-si (KR); Seong Jin Yun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 182 days.

(21) Appl. No.: 18/923,439

(22) Filed: Oct. 22, 2024

(65) Prior Publication Data

US 2025/0279768 A1 Sep. 4, 2025

(30) Foreign Application Priority Data

Feb. 29, 2024 (KR) ........................ 10-2024-0030273

(51) Int. Cl.

| | |
|---|---|
| ***H03K 3/0231*** | (2006.01) |
| ***H03B 5/04*** | (2006.01) |
| ***H03B 5/24*** | (2006.01) |
| ***H03K 3/011*** | (2006.01) |

(52) U.S. Cl.

CPC ............. *H03K 3/0231* (2013.01); *H03B 5/04* (2013.01); *H03B 5/24* (2013.01); *H03K 3/011* (2013.01)

(58) Field of Classification Search

CPC .................................................... H03K 3/0231
USPC ......................................................... 331/111
See application file for complete search history.

(56) References Cited

U.S. PATENT DOCUMENTS

| | | | | |
|---|---|---|---|---|
| 7,135,937 | B2 * | 11/2006 | Mitsuda | H03K 3/0231 331/111 |
| 7,649,425 | B2 * | 1/2010 | Nervegna | H03K 4/501 331/111 |
| 2005/0077971 | A1 * | 4/2005 | Bashar | H03K 3/0231 331/36 C |
| 2014/0197806 | A1 * | 7/2014 | Sinha | H03K 4/06 320/166 |

* cited by examiner

*Primary Examiner* — Joseph Chang

(57) ABSTRACT

An oscillator includes a relaxation oscillating circuit including a first resistor-capacitor (RC) circuit generating a first oscillation voltage at a first node and a second RC circuit generating a second oscillation voltage at a second node, and configured to output an oscillation voltage through an output line coupled to an output node, and a voltage averaging feedback circuit configured to receive a reference voltage and the oscillation voltage to output a control voltage through an output terminal. The relaxation oscillating circuit includes a leakage current compensation circuit coupled to the output line and configured to provide a leakage compensation current to the output node.

33 Claims, 19 Drawing Sheets

10

OSCILLATOR WITH LEAKAGE CURRENT COMPENSATION FUNCTION

CROSS-REFERENCE TO RELATED APPLICATIONS

The present application claims priority under 35 U.S.C. § 119(a) to Korean Patent Application No. 10-2024-0030273, filed in the Korean Intellectual Property Office on Feb. 29, 2024, which is incorporated herein by reference in its entirety.

BACKGROUND

1. Technical Field

Embodiments of the present disclosure generally relate to an oscillator, and more particularly, to an oscillator with a leakage current compensation function.

2. Related Art

In state-of-the-art technology, an entire system is integrated in a single chip. Recently, integrated circuits include analog and digital blocks required to implement high-performance and power-efficient systems. Synchronous digital circuits always require clock references. The clock reference needs to be stable over varying temperatures. External crystal oscillators achieve high-performance and are stable over a range of temperatures, but external crystal oscillators are sensitive to mechanical stress, require additional components, are expensive, require more area, and require additional pins on the chip. External components are undesirable in the recent circuit designs.

Therefore, new integrated systems require sufficiently integrated, temperature stable, accurate, and low power clock references. The frequency of the clock reference can be determined by a passive device such as a resistor, capacitor, or inductor. The on-resistance of a MOS device is not stable over a range of voltages. This is why the MOS device's influence on output frequency needs to be minimized. One problem with integrated oscillators is that the passive devices have errors depending on process and temperature, which affects the accuracy of the output frequency. Accordingly, relaxation oscillators that employ voltage averaging feedback to minimize delay in a comparator in a resistor-capacitor (RC) oscillator structure have recently been in the spotlight.

SUMMARY

An oscillator according to an embodiment of the present disclosure may include a relaxation oscillating circuit including a first resistor-capacitor (RC) circuit generating a first oscillation voltage at a first node and a second RC circuit generating a second oscillation voltage at a second node and configured to output an oscillation voltage through an output line coupled to an output node, and a voltage averaging feedback circuit configured to receive a reference voltage and the oscillation voltage to output a control voltage through an output terminal. The relaxation oscillating circuit may include a leakage current compensation circuit coupled to the output line and configured to provide a leakage compensation current to the output node.

An oscillator according to another embodiment of the present disclosure may include a relaxation oscillating circuit including a first capacitor circuit generating a first oscillation voltage at a first node and a second capacitor circuit generating a second oscillation voltage at a second node and configured to alternately output the first oscillation voltage and the second oscillation voltage through an output line coupled to an output node, and a voltage averaging feedback circuit configured to receive a reference voltage and one of the first oscillation voltage and the second oscillation voltage and to output a control voltage through an output terminal. The relaxation oscillating circuit may include a leakage current compensation circuit coupled to the output line and configured to provide a leakage compensation current to the output node.

An oscillator according to further another embodiment of the present disclosure may include a relaxation oscillating circuit including a first resistor-capacitor (RC) circuit generating a first oscillation voltage at a first node and a second RC circuit generating a second oscillation voltage at a second node and configured to alternately output the first oscillation voltage and the second oscillation voltage through an output line coupled to an output node, and a voltage averaging feedback circuit configured to receive a reference voltage and one of the first oscillation voltage and the second oscillation voltage and to output a control voltage through an output terminal. The relaxation oscillating circuit may include a leakage current compensation circuit coupled to the output line and configured to counteract a leakage current from the output node.

DETAILED DESCRIPTION

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure.

Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level that is higher than a voltage level of the logic "low" level. Logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
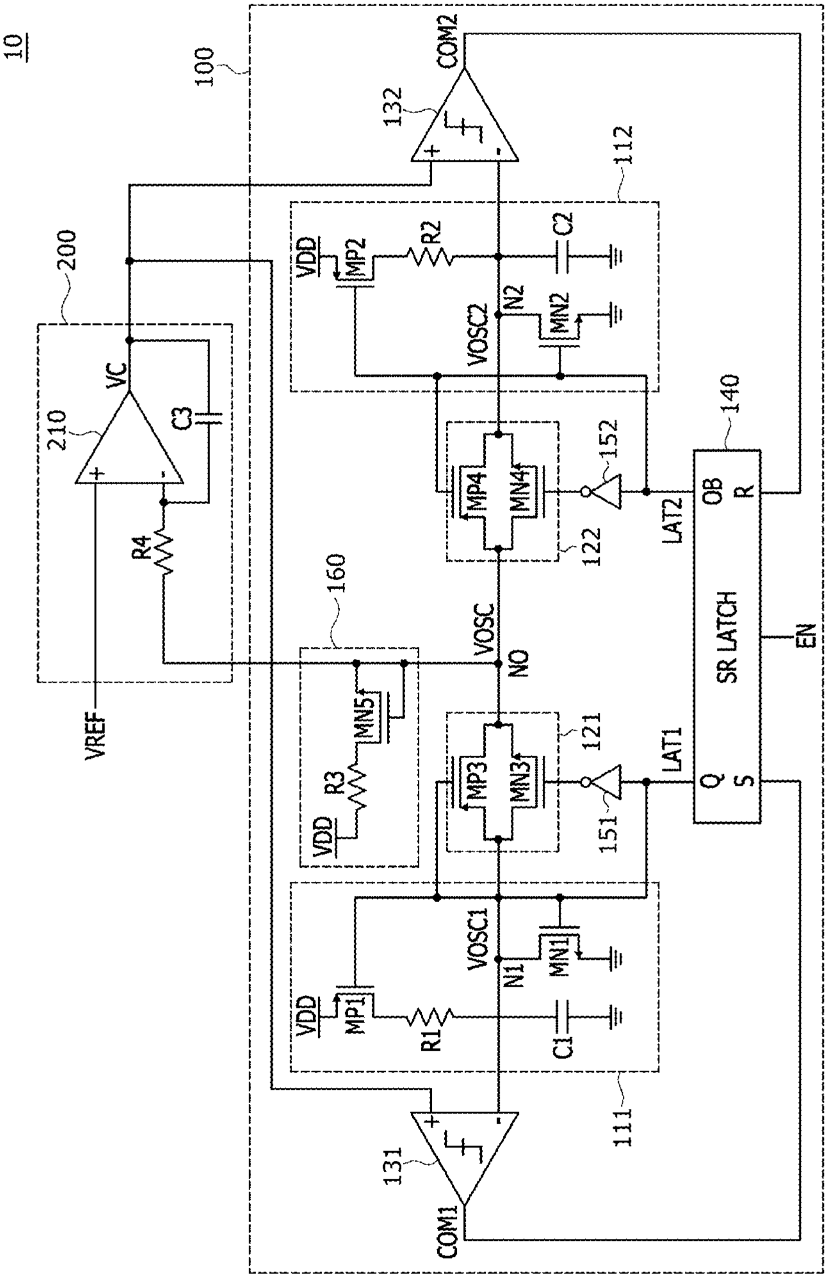
FIG. 1 is a circuit diagram illustrating an oscillator according to an embodiment of the present disclosure.
Figure 2:
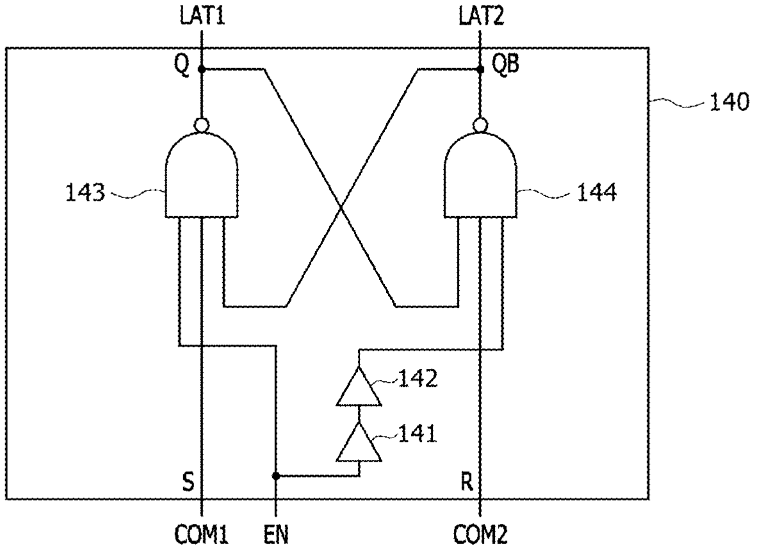
FIG. 2 is a circuit diagram illustrating an embodiment of a latch circuit included in an oscillator illustrated in FIG. 1.

FIG. 1 is a circuit diagram illustrating an oscillator according to an embodiment of the present disclosure. FIG. 2 is a circuit diagram illustrating an embodiment of a latch circuit included in an oscillator illustrated in FIG. 1.

Referring to FIG. 1, an oscillator 10 may include a relaxation oscillating circuit 100 and a voltage averaging feedback circuit 200. The relaxation oscillating circuit 100 may include a first resistor-capacitor (RC) circuit 111, a second RC circuit 112, a first switching device 121, a second switching device 122, a first comparator 131, a second comparator 132, a latch circuit 140, a first inverter 151, a second inverter 152, and a leakage current compensation circuit 160.

The first RC circuit 111 may include a first P-channel type MOS (PMOS) transistor MP1, a first resistor R1, a first capacitor C1, and a first N-channel type MOS (NMOS) transistor MN1. A source terminal of the first PMOS transistor MP1 may be coupled to a supply voltage VDD terminal to which a supply voltage VDD is applied. A drain terminal of the first PMOS transistor MP1 may be coupled to a first terminal of the first resistor R1. A gate terminal of the first PMOS transistor MP1 may be coupled to a first output terminal Q of the latch circuit 140. A second terminal of the first resistor R1 may be coupled to a first node N1. A first terminal and a second terminal of the first capacitor C1 may be coupled to the first node N1 and a ground voltage terminal to which a ground voltage is applied, respectively. A drain terminal and a source terminal of the first NMOS transistor MN1 may be coupled to the first node N1 and the ground voltage terminal, respectively. A gate terminal of the first NMOS transistor MN1 may be coupled to the first output terminal Q of the latch circuit 140.

When a signal of a logic "low" level is output from the first output terminal Q of the latch circuit 140, the first PMOS transistor MP1 may be turned on and the first NMOS transistor MN1 may be turned off. In this case, the first capacitor C1 may be charged, and a first oscillation voltage VOSC1 may be applied to the first node N1. On the other hand, when a signal of a logic "high" level is output from the first output terminal Q of the latch circuit 140, the first PMOS transistor MP1 may be turned off and the first NMOS transistor MN1 may be turned on. In this case, the first capacitor C1 may be discharged, and the voltage of the first node N1 may drop to the ground voltage.

The second RC circuit 112 may include a second PMOS transistor MP2, a second resistor R2, a second capacitor C2, and a second NMOS transistor MN2. A source terminal of the second PMOS transistor MP2 may be coupled to the supply voltage VDD terminal. A drain terminal of the second PMOS transistor MP2 may be coupled to a first terminal of the second resistor R2. A gate terminal of the second PMOS transistor MP2 may be coupled to a second output terminal QB of the latch circuit 140. A second terminal of the second resistor R2 may be coupled to a second node N2. A first terminal and a second terminal of the second capacitor C2 may be coupled to the second node N2 and the ground voltage terminal, respectively. A drain terminal and a source terminal of the second NMOS transistor MN2 may be coupled to the second node N2 and the ground voltage terminal, respectively. A gate terminal of the second NMOS transistor MN2 may be coupled to the second output terminal QB of the latch circuit 140.

When a signal of a logic "low" level is output from the second output terminal QB of the latch circuit 140, the second PMOS transistor MP2 may be turned on and the second NMOS transistor MN2 may be turned off. In this case, the second capacitor C2 may be charged, and a second oscillation voltage VOSC2 may be applied to the second node N2. On the other hand, when a signal of a logic "high" level is output from the second output terminal QB of the latch circuit 140, the second PMOS transistor MP2 may be turned off and the second NMOS transistor MN2 may be turned on. In this case, the second capacitor C2 may be discharged, and the voltage of the second node N2 may drop to the ground voltage.

The first switching device 121 may be coupled to the first node N1 and an output node NO. The first switching device 121 may have a structure of a transmission gate including a third PMOS transistor MP3 and a third NMOS transistor MN3. In an embodiment, each of the third PMOS transistor MP3 and the third NMOS transistor MN3 may have low voltage threshold (LVT) characteristics or ultra-low voltage threshold (ULVT) characteristics. A source terminal of the third PMOS transistor MP3 and a drain terminal of the third NMOS transistor MN3 may be coupled to the first node N1. A drain terminal of the third PMOS transistor MP3 and a source terminal of the third NMOS transistor MN3 may be coupled to the output node NO. A first latch signal LAT1 output from the first output terminal Q of the latch circuit 140 may be applied to a gate terminal of the third PMOS transistor MP3. An output signal from the first inverter 151 (i.e., an inverted signal of the first latch signal LAT1 output from the first output terminal Q of the latch circuit 140) may be applied to a gate terminal of the third NMOS transistor MN3. When a signal of a logic "low" level is output through the first output terminal Q of the latch circuit 140, the first switching device 121 may short the first node N1 and the output node NO. On the other hand, when a signal of a logic "high" level is output through the first output terminal Q of the latch circuit 140, the first switching device 121 may open the first node N1 and the output node NO.

The second switching device 122 may be coupled to the output node NO and the second node N2. The second switching device 122 may have a structure of a transmission gate including a fourth PMOS transistor MP4 and a fourth NMOS transistor MN4. In an embodiment, each of the fourth PMOS transistor MP4 and the fourth NMOS transistor MN4 may have LVT characteristics or ULVT characteristics. A source terminal of the fourth PMOS transistor MP4 and a drain terminal of the fourth NMOS transistor MN4 may be coupled to the output node NO. A drain terminal of the fourth PMOS transistor MP4 and a source terminal of the fourth NMOS transistor MN4 may be coupled to the second node N2. A second latch signal LAT2 output from the second output terminal QB of the latch circuit 140 may be applied to a gate terminal of the fourth PMOS transistor MP4. An output signal from the second inverter 152 (i.e., an inverted signal of the second latch signal LAT2 output from the second output terminal QB of the latch circuit 140) may be applied to a gate terminal of fourth NMOS transistor MN4. When a signal of a logic "low" level is output through the second output terminal QB of the latch circuit 140, the second switching device 122 may short the output node NO and the second node N2. On the other hand, when a signal of a logic "high" level is output through the second output terminal QB of the latch circuit 140, the second switching device 122 may open the output node NO and the second node N2.

The first comparator 131 may include a first input terminal, a second input terminal, and an output terminal. The first input terminal of the first comparator 131 may be coupled to an output terminal of the voltage averaging feedback circuit 200. The second input terminal of the first comparator 131 may be coupled to the first node N1. In an embodiment, the first input terminal and the second input terminal of the first comparator 131 may be a positive terminal and a negative terminal, respectively. The output terminal of the first comparator 131 may be coupled to a first input terminal S of the latch circuit 140. The first comparator 131 may compare a control voltage VC output from the output terminal of the voltage averaging feedback circuit 200 with the first oscillation voltage VOSC1 at the first node N1, and output a first comparison signal COM1 having a logic level according to the comparison result. In an embodiment, when a magnitude of the first oscillation voltage VOSC1 is smaller than that of the control voltage VC, the first comparator 131 may output a signal of a logic "high" level as the first comparison signal COM1. On the other hand, when the magnitude of the first oscillation voltage VOSC1 is greater than that of the control voltage VC, the first comparator 131 may output a signal of a logic "low" level as the first comparison signal COM1.

The second comparator 132 may include a first input terminal, a second input terminal, and an output terminal. The first input terminal of the second comparator 132 may be coupled to the output terminal of the voltage averaging feedback circuit 200. The second input terminal of the second comparator 132 may be coupled to the second node N2. In an embodiment, the first input terminal and the second input terminal of the second comparator 132 may be a positive terminal and a negative terminal, respectively. The output terminal of the second comparator 132 may be coupled to a second input terminal R of the latch circuit 140. The second comparator 132 may compare the control voltage VC output from the output terminal of the voltage averaging feedback circuit 200 with a second oscillation voltage VOSC2 at the second node N2, and output a second comparison signal COM2 having a logic level according to the comparison result. In an embodiment, when a magnitude of the second oscillation voltage VOSC2 is smaller than that of the control voltage VC, the second comparator 132 may output a signal of a logic "high" level as the second comparison signal COM2. On the other hand, when the magnitude of the second oscillation voltage VOSC2 is greater than that of the control voltage VC, the second comparator 132 may output a signal of a logic "low" level as the second comparison signal COM2.

The latch circuit 140 may include an enable terminal to which an enable signal EN is input, the first input terminal S to which the first comparison signal COM1 from the first comparator 131 is input, and the second input terminal R to which the second comparison signal COM2 from the second comparator 132 is input. The latch circuit 140 may include the first output terminal Q and the second output terminal QB. The first output terminal Q of the latch circuit 140 may be coupled to the gate terminals of the first PMOS transistor MP1 and the first NMOS transistor MN1 included in the first RC circuit 111, the gate terminal of the third PMOS transistor MP3 of the first switching device 121, and the input terminal of the first inverter 151. The second output terminal QB of the latch circuit 140 may be coupled to the gate terminals of the second PMOS transistor MP2 and the second NMOS transistor MN2 included in the second RC circuit 112, the gate terminal of the fourth PMOS transistor MP4 of the second switching device 122, and the input terminal of the second inverter 152.

Referring to FIG. 2, the latch circuit 140 may be a gate set-reset (SR) NAND latch circuit. The latch circuit 140 may include a first buffer 141, a second buffer 142, a first NAND gate 143, and a second NAND gate 144. An input terminal of the first buffer 141 may be coupled to the enable terminal to which the enable signal EN is input. An output terminal of the first buffer 141 may be coupled to an input terminal of the second buffer 142. An output terminal of the second buffer 142 may be coupled to one of three input terminals of the second NAND gate 144. The first buffer 141 and the second buffer 142 may delay the enable signal EN that is input through the enable terminal from reaching the second NAND gate 144 by delaying a time to transmit the enable signal EN. In the process of performing the start-up sequence of the oscillator (10 in FIG. 1), even if the logic level of the enable signal EN transitions from a logic "low" level to a logic "high" level, the enable signal EN of the logic "high" level may be transmitted to the second NAND gate 144 when the delay time of the first buffer 141 and the second buffer 142 has elapsed. In this embodiment, the two buffers 141 and 142 are used as an example, but the number of buffers may be more than two.

The first NAND gate 143 may have three input terminals and one output terminal. One of the three input terminals of the first NAND gate 143 may be coupled to the enable terminal to which the enable signal EN is input. Another one of the three input terminals of the first NAND gate 143 may be coupled to the first input terminal S of the latch circuit 140. Accordingly, the first NAND gate 143 may receive the first comparison signal COM1 input from the first input terminal S. The remaining one of the three input terminals of the first NAND gate 143 may be coupled to an output terminal of the second NAND gate 144, that is, the second output terminal QB of the latch circuit 140. The output terminal of the first NAND gate 143 may be coupled to one of the input terminals of the second NAND gate 144 and the first output terminal Q of the latch circuit 140. The first NAND gate 143 may output a first latch signal LAT1 through the output terminal.

Similar to the first NAND gate 143, the second NAND gate 144 may also have three input terminals and one output terminal. One of the three input terminals of the second NAND gate 144 may be coupled to the output terminal of the second buffer 142. Another one of the three input terminals of the second NAND gate 144 may be coupled to the second input terminal R of the latch circuit 140. Accordingly, the second NAND gate 144 may receive the second comparison signal COM2 input from the second input terminal R of the latch circuit 140. The remaining one of the three input terminals of the second NAND gate 144 may be coupled to the output terminal of the first NAND gate 143, that is, the first output terminal Q of the latch circuit 140. The output terminal of the second NAND gate 144 may be coupled to one of the input terminals of the first NAND gate 143 and the second output terminal QB of the latch circuit 140. The second NAND gate 144 may output a second latch signal LAT2 through the output terminal.

Referring back to FIG. 1, the first inverter 151 of the relaxation oscillating circuit 100 may receive the first latch signal LAT1, which is output from the first output terminal Q of the latch circuit 140, through an input terminal. The first inverter 151 may output an inverted signal of the first latch signal LAT1 through an output terminal. The output terminal of the first inverter 151 may be coupled to the gate terminal of the third NMOS transistor MN3 of the first switching device 121. The second inverter 152 of the relaxation oscillating circuit 100 may receive the second latch signal LAT2, which is output from the second output terminal QB of the latch circuit 140, through an input terminal. The second inverter 152 may output an inverted signal of the second latch signal LAT2 through an output terminal. The output terminal of the second inverter 152 may be coupled to the gate terminal of the fourth NMOS transistor MN4 of the second switching device 122.

The leakage current compensation circuit 160 may include a third resistor R3 and a fifth NMOS transistor MN5. The third resistor R3 may be coupled to the supply voltage VDD terminal and a drain terminal of the fifth NMOS transistor MN5. A gate terminal and a source terminal of the fifth NMOS transistor MN5 may each be coupled to the output node NO through an output line of the relaxation oscillating circuit 100. In another embodiment, the leakage current compensation circuit 160 might not include the third resistor R3, and the drain terminal of the fifth NMOS transistor MN5 may be directly coupled to the supply voltage VDD terminal. Because the gate terminal and source terminal of the fifth NMOS transistor MN5 are short-circuited, a gate-source voltage VGS of the fifth NMOS transistor MN5 may maintain 0 V. Accordingly, in the fifth NMOS transistor MN5, a leakage compensation current corresponding to a drain-source voltage VDS, that is, a leakage compensation current corresponding to a difference VDD-VOSC, located between the supply voltage VDD and the oscillation voltage VOSC, may flow from the drain terminal to the source terminal. Here, the leakage compensation current may be defined as the off-leakage current of the fifth NMOS transistor MN5. The leakage compensation current flowing from the drain terminal to the source terminal of the fifth NMOS transistor MN5 may flow to the output node NO along the output line of the relaxation oscillating circuit 100. The operation of the leakage current compensation circuit 160 will be described in more detail with reference to FIG. 11 below.

The voltage averaging feedback circuit 200 may be configured as an active filter. The voltage averaging feedback circuit 200 may include a feedback amplifier 210, a fourth resistor R4, and a third capacitor C3. In an embodiment, the feedback amplifier 210 may be an operational amplifier. The feedback amplifier 210 may include a positive input terminal, a negative input terminal, and an output terminal. The positive input terminal of the feedback amplifier 210 may be coupled to a reference voltage VREF terminal, to which a reference voltage VREF is applied. The negative input terminal of the feedback amplifier 210 may be coupled to the fourth resistor R4. The output terminal of the feedback amplifier 210 may be coupled to the negative input terminal through the third capacitor C3. The output terminal of the feedback amplifier 210 may also be coupled to the positive input terminal of the first comparator 131 and the positive input terminal of the second comparator 132. The fourth resistor R4 may be coupled to the output line of the relaxation oscillating circuit 100. The feedback amplifier 210 may output a control voltage VC through the output terminal. The control voltage VC may have a magnitude corresponding to a direct current DC component of the oscillation voltage VOSC from the output node NO, which is connected to the relaxation oscillating circuit 100 through its output line. Because the control voltage VC is transmitted to the positive input terminal of the first comparator 131 and the positive input terminal of the second comparator 132, the influence from delay in the first comparator 131 and the second comparator 132 can be minimized.

FIGS. 3 to 10 are circuit diagrams illustrating start-up sequence operations of an oscillator shown in FIG. 1. The same reference numerals as in FIG. 1 indicate the same components in FIGS. 3 to 9, so overlapping descriptions will be omitted below.

Figure 3:
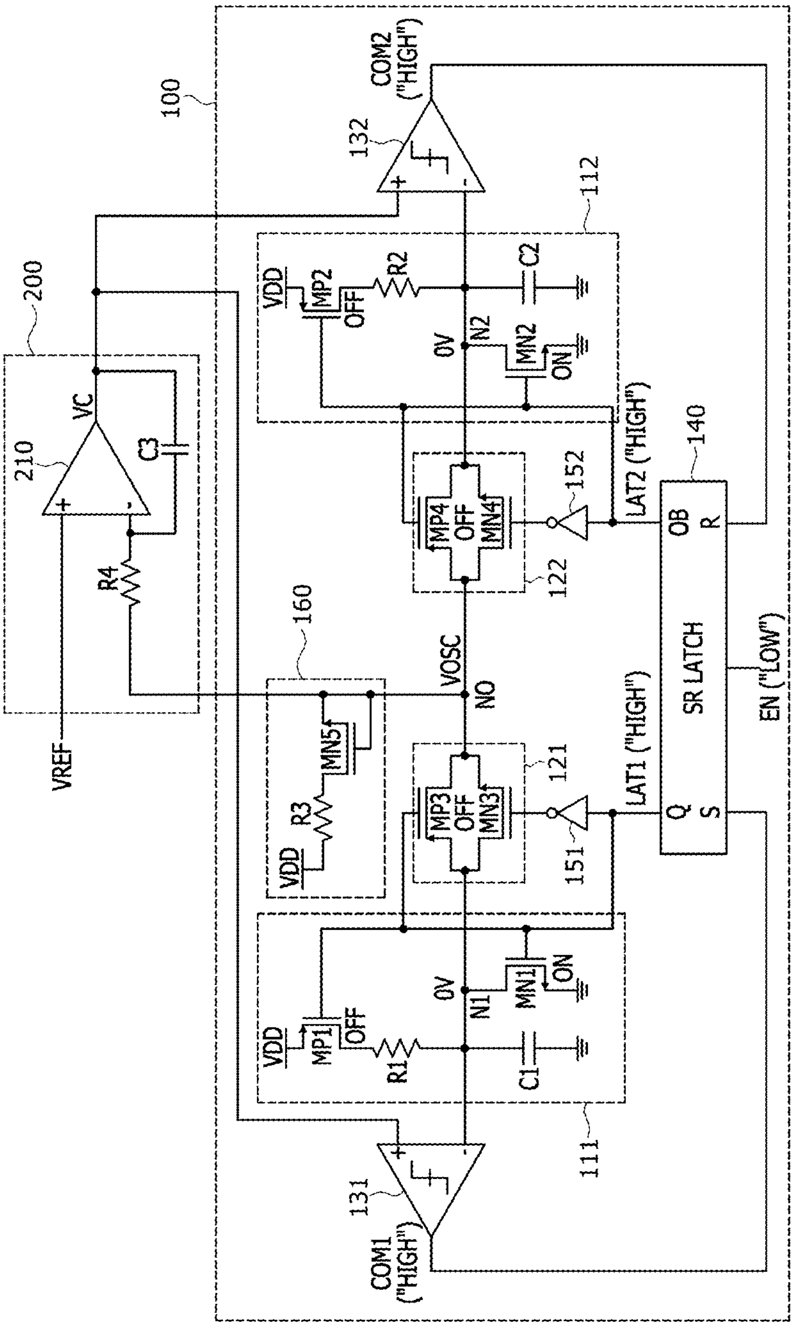
FIGS. 3 to 10 are circuit diagrams illustrating start-up sequence operations of an oscillator shown in FIG. 1.

Referring to FIG. 3, when an enable signal EN input to an enable terminal EN of a latch circuit 140 is at a logic "low" level, a first latch signal LAT1 of a logic "high" level and a second latch signal LAT2 of a logic "high" level may be output through a first output terminal Q and a second output terminal QB of the latch circuit 140, respectively. The first PMOS transistor MP1 of the first RC circuit 111 may be turned off from the first latch signal LAT1 with a logic "high" level, and the first NMOS transistor MN1 of the first RC circuit 111 may be turned on. In addition, the third PMOS transistor MP3 and the third NMOS transistor MN3 of the first switching device 121 may be turned off, so that the first node N1 and the output node NO may be opened. Accordingly, the voltage at the first node N1 may be pulled-down to the ground voltage, that is, 0 V. Similarly, the second PMOS transistor MP2 of the second RC circuit 112 may be turned off by the second latch signal LAT2 of a logic "high" level, and the second NMOS transistor MN2 of the second RC circuit 112 may be turned on. Additionally, the fourth PMOS transistor MP4 and the fourth NMOS transistor MN4 of the second switching device 122 may be turned off, so that the output node NO and the second node N2 may be opened. Accordingly, the voltage at the second node N2 may also be pulled-down to the ground voltage, that is, 0 V. The initial voltage of the control voltage VC may be set to an appropriate voltage, for example, the reference voltage VREF. Accordingly, a first comparison signal COM1 of a logic "high" level may be output from the first comparator 131, and a second comparison signal COM2 of a logic "high" level may be output from the second comparator 132.

Figure 4:
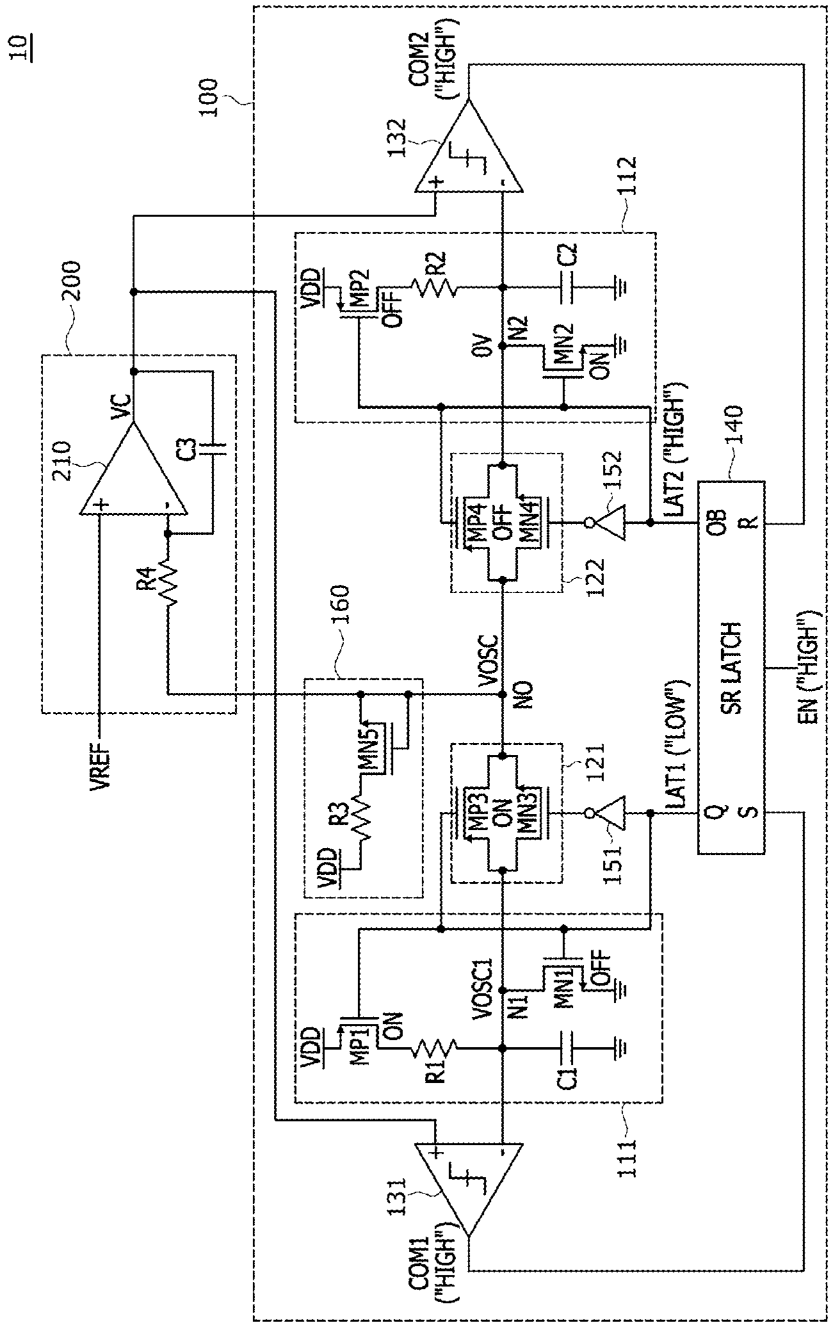

Next, referring to FIG. 4, when the logic level of the enable signal EN input to the enable terminal of the latch circuit 140 transitions from a logic "low" level to a logic "high" level, as described with reference to FIG. 2, a signal of a logic "high" level may be input to all three input terminals of the first NAND gate (143 in FIG. 2). Therefore, the logic level of a first latch signal LAT1 output from the output terminal of the first NAND gate (143 in FIG. 2), that is, the first output terminal Q of the latch circuit 140, may transition from a logic "high" level to a logic "low" level. On the other hand, due to the delay time of each of the buffers (141 and 142 in FIG. 2), an enable signal EN of a logic "low" level may be transmitted to the second NAND gate (144 in FIG. 2) of the latch circuit 140. Accordingly, the logic level of the second latch signal LAT2 output from the output terminal of the second NAND gate (144 in FIG. 2), that is, the second output terminal QB of the latch circuit 140, may maintain a logic "high" level. Referring back to FIG. 4, the third PMOS transistor MP3 and the third NMOS transistor MN3 of the first switching device 121 may be turned on by the first latch signal LAT1 of a logic "low" level from first output terminal Q. On the other hand, the fourth PMOS transistor MP4 and the fourth NMOS transistor MN4 of the second switching device 122 may be turned off by the second latch signal LAT2 of a logic "high" level from second output terminal QB.

The first RC circuit 111 may perform a first charging process with a first latch signal LAT1 of a logic "low" level. Specifically, the first PMOS transistor MP1 of the first RC circuit 111 may be turned on, and the first NMOS transistor MN1 may be turned off. As the first PMOS transistor MP1 and the first NMOS transistor MN1 of the first RC circuit 111 are turned on and off, respectively, the first capacitor C1 of the first RC circuit 111 may begin to be charged, and the voltage at the first node N1 may be increased to the first oscillation voltage VOSC1. Because the first switching device 121 is turned on and the second switching device 122 is turned off, the oscillation voltage VOSC at the output node NO may be the same as the first oscillation voltage VOSC1 at the first node N1. That is, the first oscillation voltage VOSC1 may be transmitted from the output node NO to the voltage averaging feedback circuit 200 through the output line of the relaxation oscillating circuit 100. In FIG. 4, the second RC circuit 112 maintains the same state as described above with reference to FIG. 3.

The output signal of the voltage averaging feedback circuit 200 may fluctuate up and down until the oscillation operation is stabilized and reaches equilibrium. Hereinafter, it is assumed that the control voltage VC output from the voltage averaging feedback circuit 200 has a magnitude that allows the direct current (DC) voltage of the oscillation voltage VOSC to be equal to the reference voltage VREF.

Figure 5:
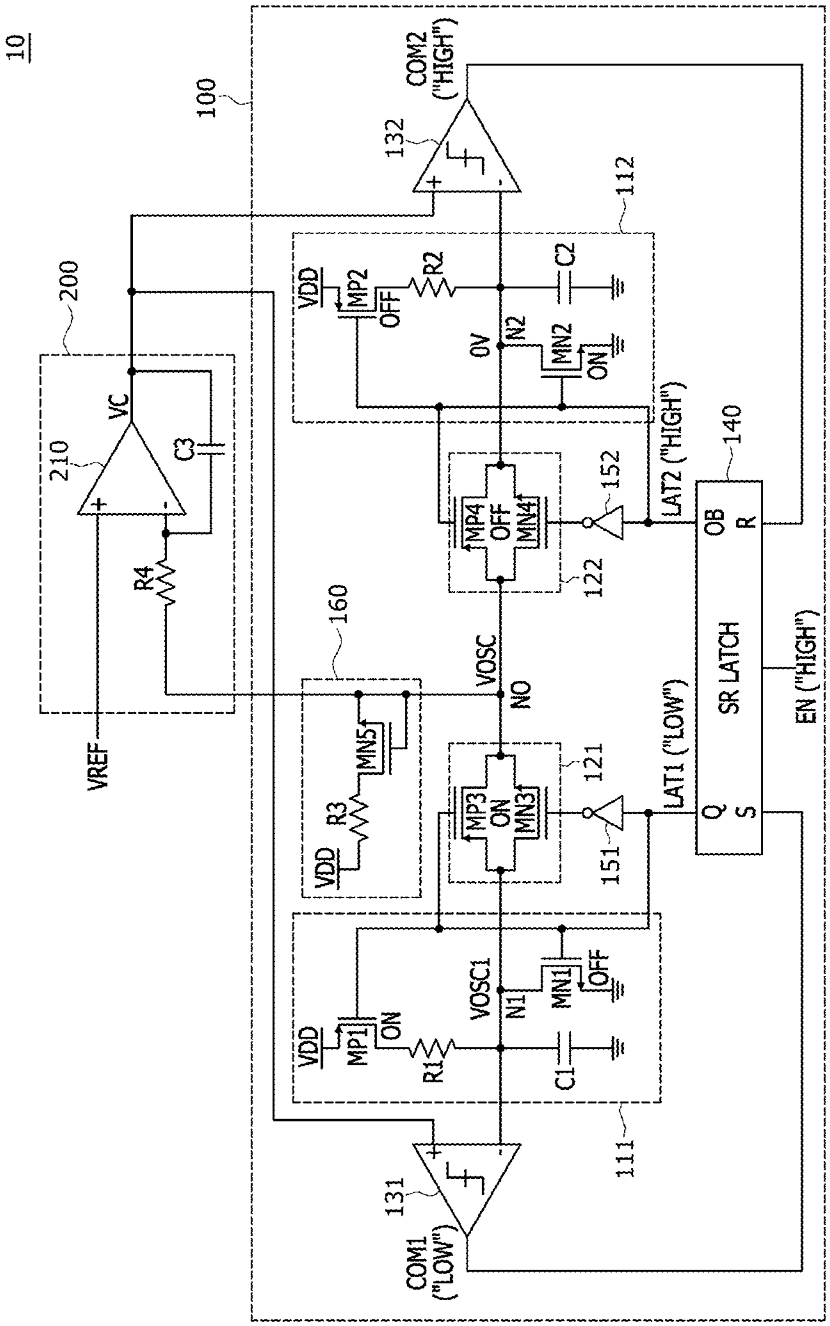

Next, referring to FIG. 5, the control voltage VC from the voltage averaging feedback circuit 200 is input to the positive input terminal of the first comparator 131 and the positive input terminal of the second comparator 132. When the magnitude of the first oscillation voltage VOSC1 becomes greater than that of the control voltage VC, the logic level of the first comparison signal COM1 output through the output terminal of the first comparator 131 may transition from a logic "high" level to a logic "low" level. The second comparison signal COM2 output through the output terminal of the second comparator 132 may be maintained at a logic "high" level.

Figure 6:
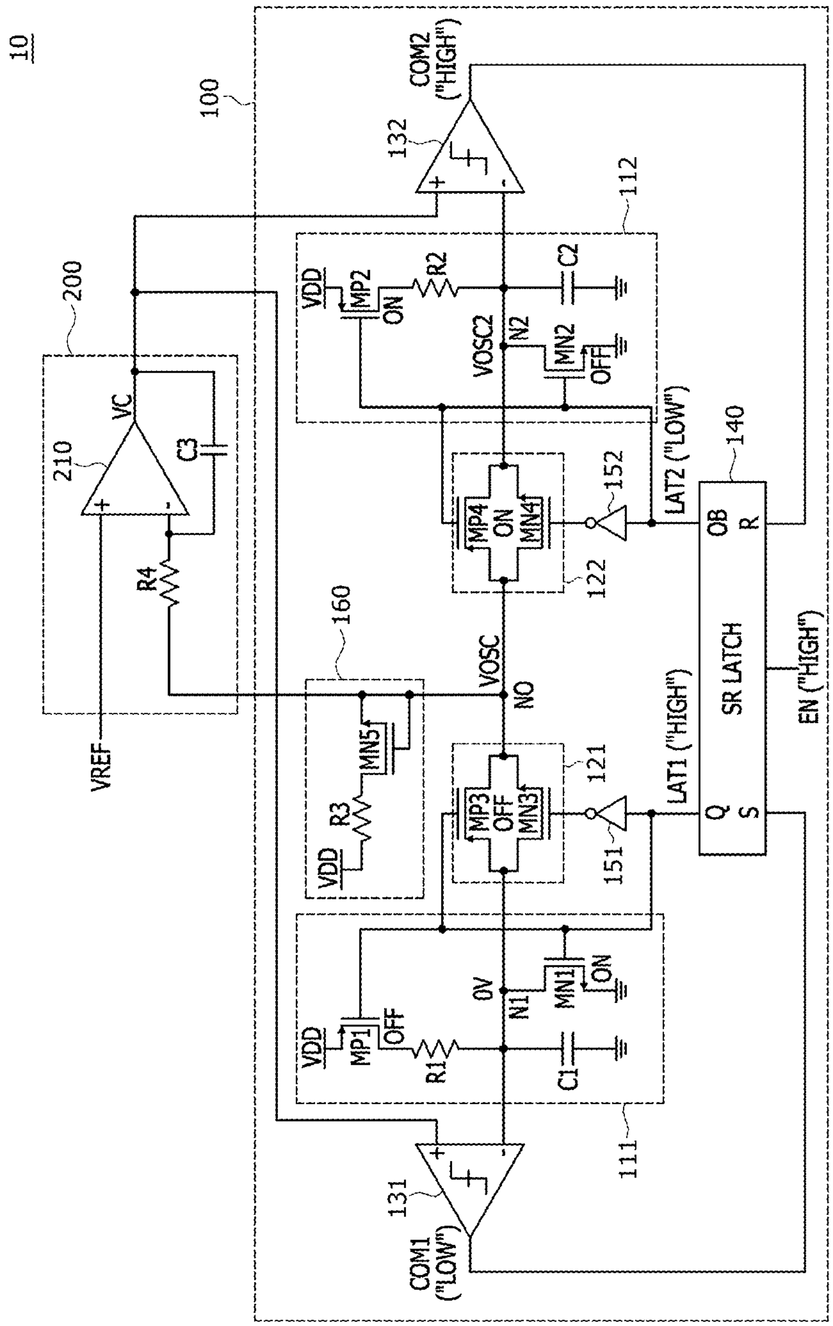

Next, referring to FIG. 6, the first comparison signal COM1 of a logic "low" level is transmitted from the first comparator 131 to the first input terminal S of the latch circuit 140. As described above and with reference to FIG. 2, the first NAND gate 143 of the latch circuit 140 may output a signal of a logic "high" level. That is, the first latch signal LAT1 of a logic "high" level may be output through the first output terminal Q of the latch circuit 140. With the first NAND gate 143 output of a signal of a logic "high" level and the enable signal EN of a logic "high" level input to the second NAND gate 144, signal of a logic "high" level may be input to all three input terminals of the second NAND gate 144 of the latch circuit 140 illustrated in FIG. 2. Accordingly, the second NAND gate 144 of the latch circuit 140 may output a signal of a logic "low" level. That is, the second latch signal LAT2 of a logic "low" level may be output through the second output terminal QB of the latch circuit 140. The third PMOS transistor MP3 and the third NMOS transistor MN3 of the first switching device 121 may be turned off by the first latch signal LAT1 of a logic "high" level. In addition, the fourth PMOS transistor MP4 and the fourth NMOS transistor MN4 of the second switching device 122 may be turned on by the second latch signal LAT2 of a logic "low" level.

With the first latch signal LAT1 at a logic "high" level, the first RC circuit 111 may perform a first discharging process. Specifically, the first PMOS transistor MP1 of the first RC circuit 111 may be turned off, and the first NMOS transistor MN1 may be turned on. The first switching device 121 is turned off and first node N1 and the output node NO are opened, and the first PMOS transistor MP1 and the first NMOS transistor MN1 of the first RC circuit 111 are turned off and turned on, respectively. As a result, the first capacitor C1 of the first RC circuit 111 may begin to be discharged and the voltage at the first node N1 may drop to 0 V.

On the other hand, with the second latch signal LAT2 at a logic "low" level, the second RC circuit 112 may perform a first charging process. Specifically, the second PMOS transistor MP2 of the second RC circuit 112 may be turned on, and the second NMOS transistor MN2 of the second RC circuit 112 may be turned off. Accordingly, the second capacitor C2 of the second RC circuit 112 may begin to be charged, and the voltage at the second node N2 may be increased to the second oscillation voltage VOSC2. Because the first switching device 121 is turned off and the second switching device 122 is turned on, the oscillation voltage VOSC at the output node NO may be equal to the second oscillation voltage VOSC2 at the second node N2. That is, the second oscillation voltage VOSC2 may be transmitted from the output node NO to the voltage averaging feedback circuit 200 through the output line of the relaxation oscillating circuit 100.

Figure 7:
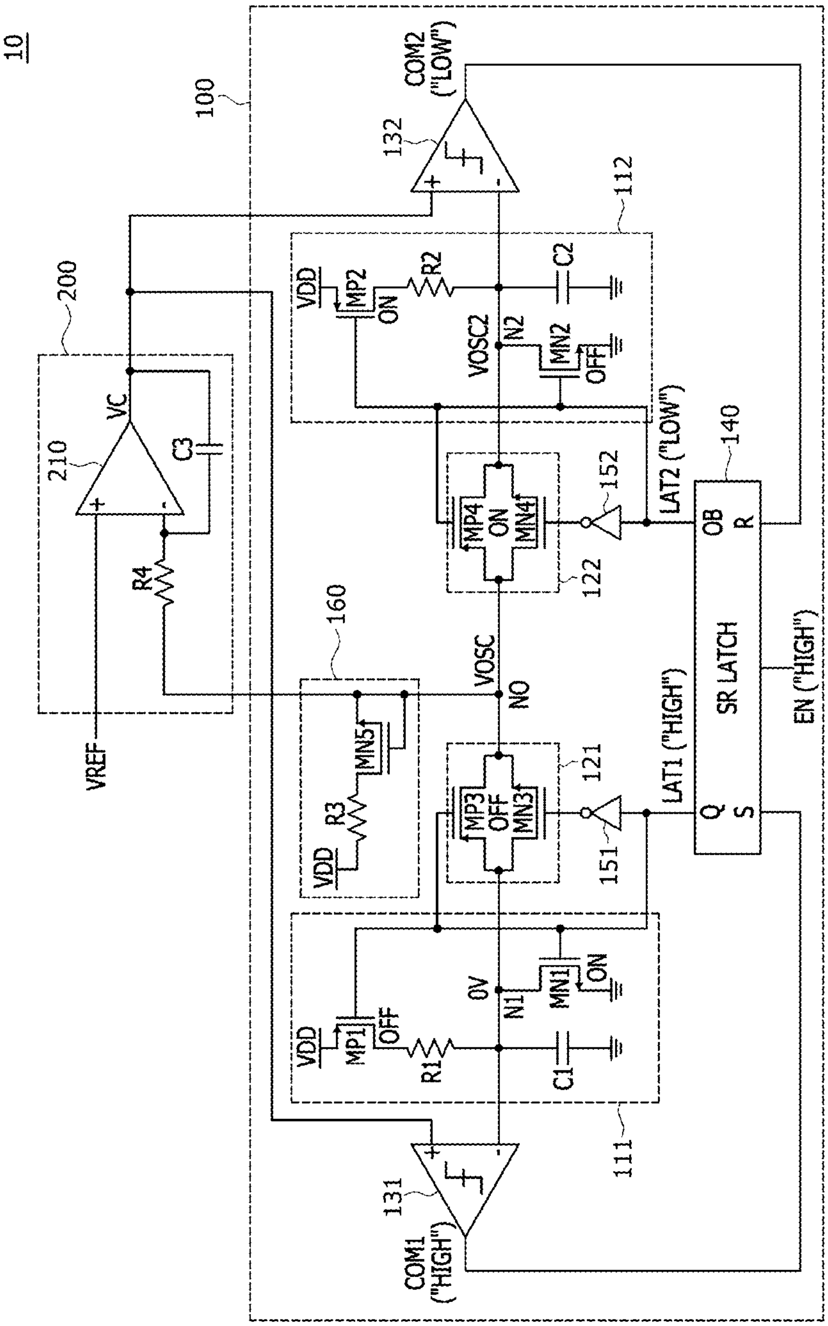

Next, referring to FIG. 7, the voltage at the first node N1 may be pulled down to 0 V from the first discharging process of the first RC circuit 111. Accordingly, the logic level of the first comparison signal COM1 output from the output terminal of the first comparator 131 may transition from a logic "low" level to a logic "high" level. The first comparison signal COM1 of a logic "high" level is input to the first input terminal S of the latch circuit 140. Even though a signal of a logic "low" level output from the second NAND gate 144 is input to one of the three input terminals of the first NAND gate 143 of the latch circuit 140, the first latch signal LAT1 output from the first output terminal Q of the latch circuit 140 remains at a logic "high" level. When the magnitude of the second oscillation voltage VOSC2 becomes greater than that of the control voltage VC during the first charging process in the second RC circuit 112, the logic level of the second comparison signal COM2 output through the output terminal of the second comparator 132 may transition from a logic "high" level to a logic "low" level.

Figure 8:
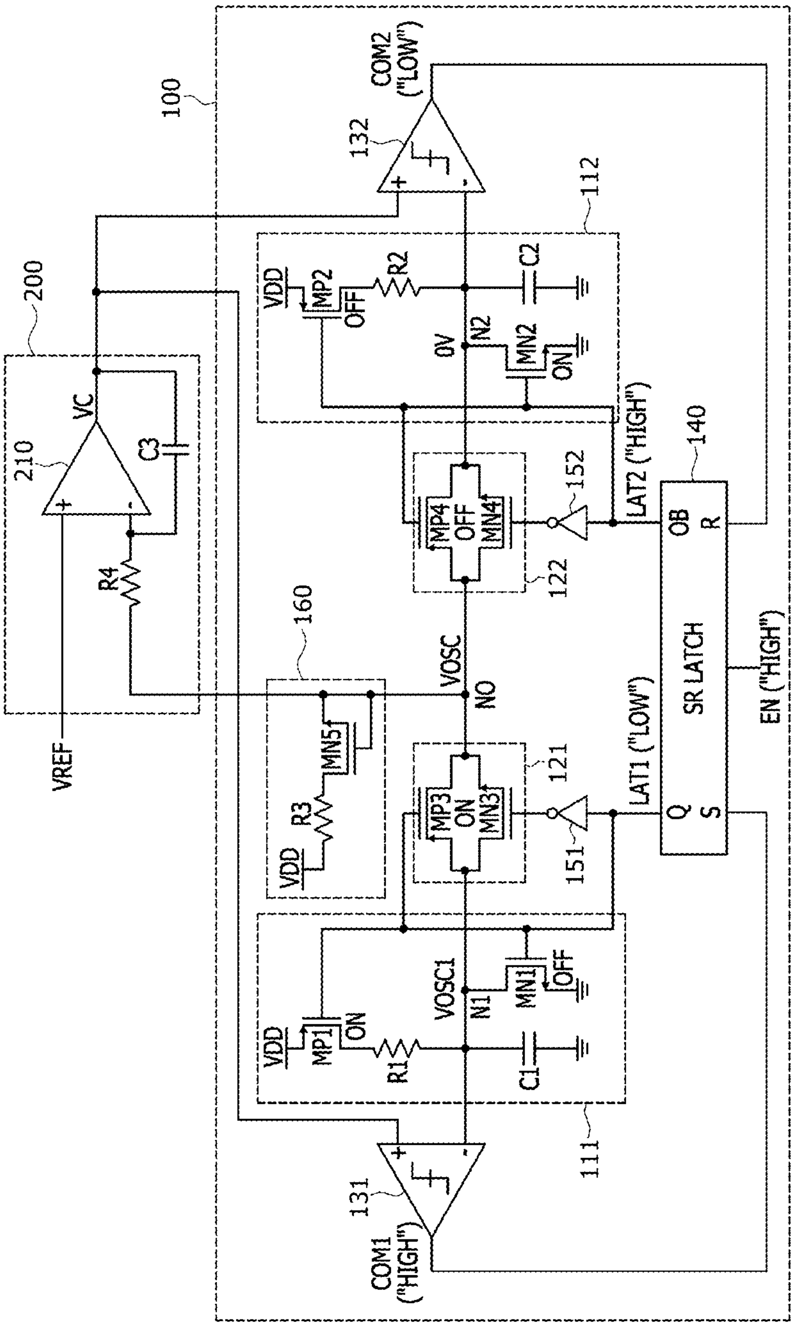

Next, referring to FIG. 8, as the second comparison signal COM2 of a logic "low" level output from the second comparator 132 is input to the second input terminal R of the latch circuit 140, as described with reference to FIG. 2, the second NAND gate 144 of the latch circuit 140 may output the second latch signal LAT2 of a logic "high" level. With the second latch signal LAT2 output at a logic "high" level, signals of a logic "high" level are input to all three input terminals of the first NAND gate 143 of the latch circuit 140. As a result, the first NAND gate 143 of the latch circuit 140 may output the first latch signal LAT1 of a logic "low" level The third PMOS transistor MP3 and the third NMOS transistor MN3 of the first switching device 121 may be turned on by the first latch signal LAT1 of a logic "low" level. In addition, the fourth PMOS transistor MP4 and the fourth NMOS transistor MN4 of the second switching device 122 may be turned off by the second latch signal LAT2 of a logic "high" level.

With the first latch signal LAT1 at a logic "low" level, the first RC circuit 111 may perform a second charging process. Specifically, the first PMOS transistor MP1 of the first RC circuit 111 may be turned on, and the first NMOS transistor MN1 of the first RC circuit 111 may be turned off. Accordingly, the first capacitor C1 of the first RC circuit 111 may begin to be charged, and the voltage at the first node N1 may be increased to the first oscillation voltage VOSC1. Because the first switching device 121 is in a turned-on state and the second switching device 122 is in a turned-off state, the oscillation voltage VOSC at the output node NO may be equal to the first oscillation voltage VOSC1 at the first node N1. That is, the first oscillation voltage VOSC1 may be transmitted from the output node NO to the voltage averaging feedback circuit 200 through the output line of the relaxation oscillating circuit 100.

On the other hand, with the second latch signal LAT2 at a logic "high" level, the second RC circuit 112 may perform a first discharging process. Specifically, the second PMOS transistor MP2 of the second RC circuit 112 may be turned off, and the second NMOS transistor MN2 of the second RC circuit 112 may be turned on. The second switching device 122 is turned off so that the output node NO and the first node N1 are open-circuited, and the second PMOS transistor MP2 and the second NMOS transistor MN2 of the second RC circuit 112 are turned off and turned on, respectively. The second capacitor C2 of the second RC circuit 112 may begin to be discharged, and the voltage at the second node N2 may drop to 0 V.

Figure 9:
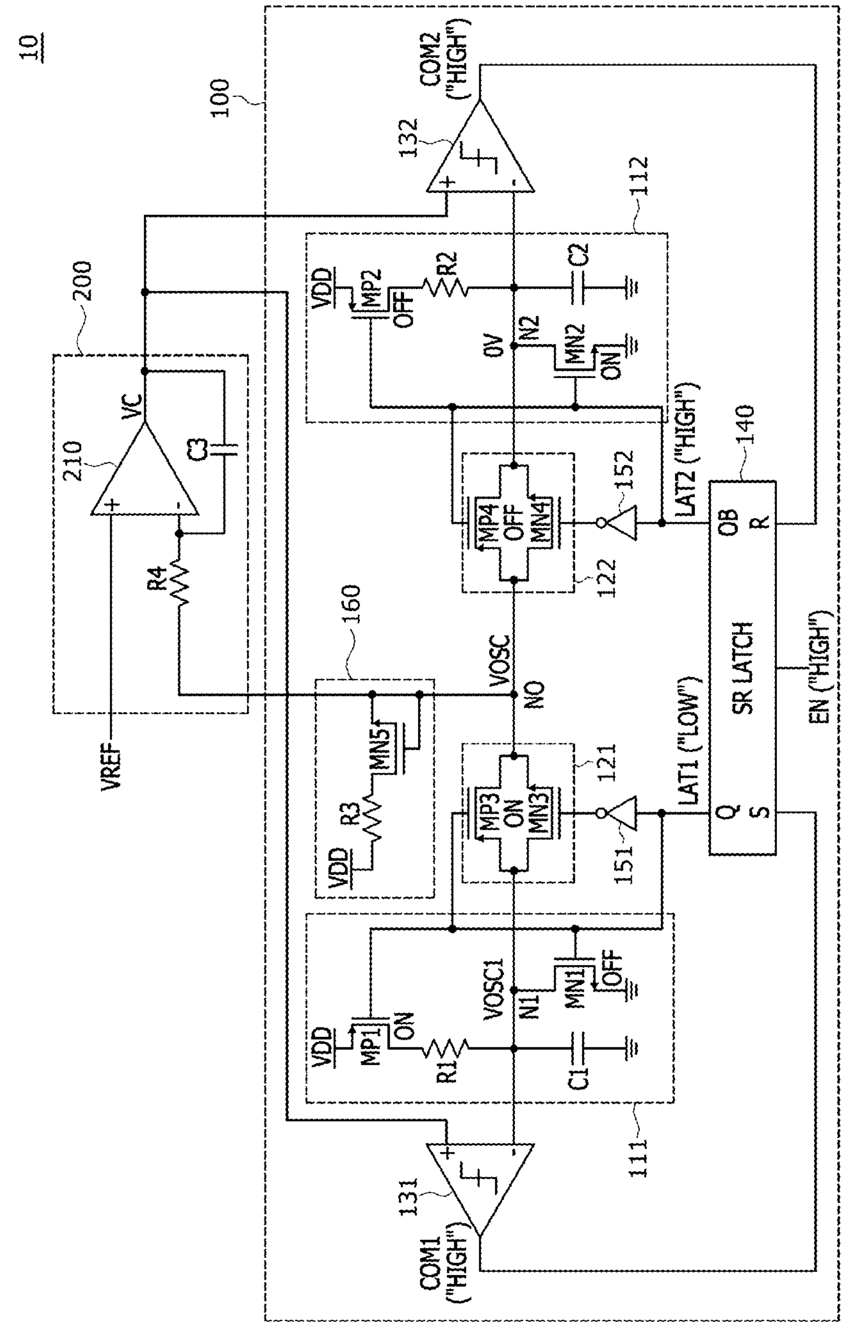

Next, referring to FIG. 9, because the voltage at the second node N2 is pulled-down through the first discharging process of the second RC circuit 112, the logic level of the second comparison signal COM2 output from the output terminal of the second comparator 132 may transition from a logic "low" level to a logic "high" level. As described above with reference to FIG. 2, the second comparison signal COM2 of a logic "high" level is input to the second input terminal R of the latch circuit 140, and a signal of a logic "low" level output from the first NAND gate 143 is input to one of the three input terminals of the second NAND gate 144 of the latch circuit 140. As a result, the second latch signal LAT2 output from the second output terminal QB of the latch circuit 140 may be maintained at a logic "high" level.

Figure 10:
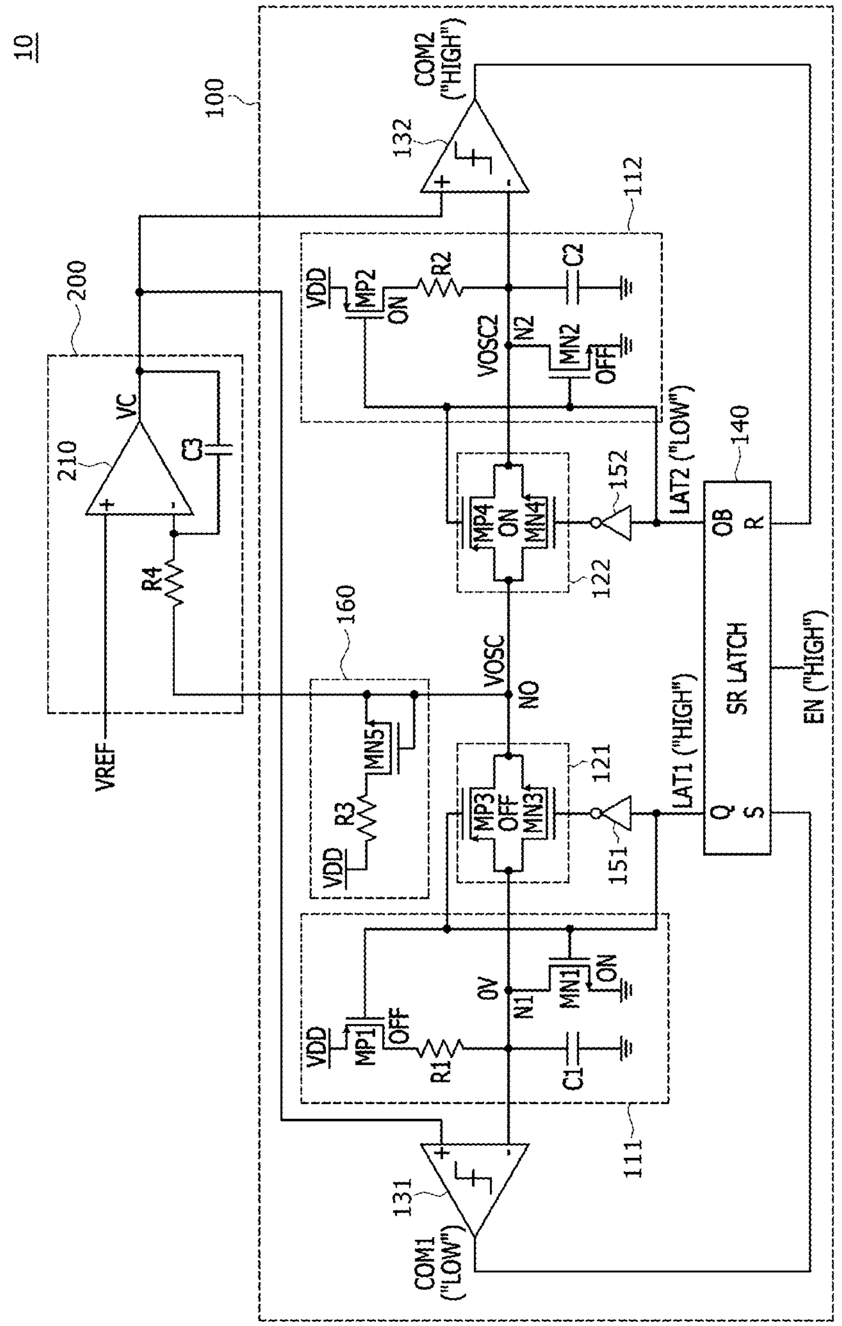

Next, referring to FIG. 10, when the magnitude of the first oscillation voltage VOSC1 becomes greater than that of the control voltage VC in the second discharging process of the first RC circuit 111, the logic level of the first comparison signal COM1 output through the output terminal of the first comparator 131 may transition from a logic "high" level to a logic "low" level. The latch circuit 140 that receives the first comparison signal COM1 of a logic "low" level through the first input terminal S may output the first latch signal LAT1 of a logic "high" level through the first output terminal Q and output the second latch signal LAT2 of a logic "low" level through the second output terminal QB. The third PMOS transistor MP3 and the third NMOS transistor MN3 of the first switching device 121 may be turned off by the first latch signal LAT1 of a logic "high" level. The third PMOS transistor MP3 and the third NMOS transistor MN3 of the second switching device 122 may be turned on by the second latch signal LAT2 of a logic "low" level. With the first latch signal LAT1 at a logic "high" level, the first RC circuit 111 may perform a second discharging process. On the other hand, with the second latch signal LAT2 at a logic "low" level, the second RC circuit 112 may perform a second charging process. The second discharging process in the first RC circuit 111 and the second charging process in the second RC circuit 122 may be performed in the same manner as the first discharging process in the first RC circuit 111 and the first charging process in the second RC circuit 112 described above and with reference to FIG. 5, respectively, and so overlapping descriptions will be omitted.

When the second discharging process in the first RC circuit 111 and the second charging process in the second RC circuit 112 are performed, a third charging process in the first RC circuit 111 and a second discharging process in the second RC circuit 112 may be performed in the same manner as the second charging process in the first RC circuit 111 and the first discharging process in the second RC circuit 112 described above and with reference to FIG. 7, respectively. Charging the first RC circuit 111 and discharging the second RC circuit 112, and discharging the first RC circuit 111 and charging the second RC circuit 112 are alternately performed. Consequently, oscillator 10 may be stabilized and a start-up sequence of the oscillator 10 may be completed.

After the oscillator 10 is stabilized by alternately charging the first RC circuit 111 and discharging the second RC circuit 112, then discharging the first RC circuit 111 and charging the second RC circuit 112, the oscillation voltage VOSC, which is the sum of the first oscillation voltage VOSC1 at the first node N1 and the second oscillation voltage VOSC2 at the second node N2, may be output from the output node NO of the relaxation oscillating circuit 100 through its output line. The charging in the first RC circuit 111 and discharging in the second RC circuit 112 may be performed in the same manner as the second charging in the first RC circuit 111 and the first discharging in the second RC circuit 112 described above and with reference to FIG. 7. The discharging in the first RC circuit 111 and charging in the second RC circuit 112 may be performed in the same manner as the second discharging in the first RC circuit 111 and second charging in the second RC circuit 112 described above and with reference to FIG. 10.

Figure 11:
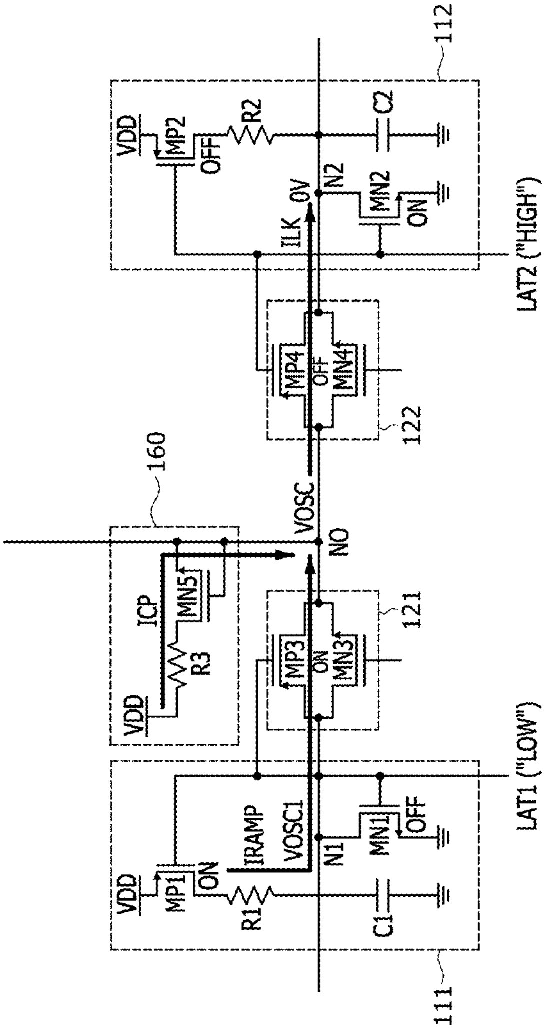
FIG. 11 is a diagram illustrating a phenomenon in which a leakage current is generated during an operation of an oscillator shown in FIG. 1 and an operation of a leakage current compensation circuit to suppress the leakage current.

FIG. 11 illustrates a phenomenon in which a leakage current is generated during an operation of an oscillator shown in FIG. 1 and an operation of a leakage current compensation circuit to suppress the leakage current. In FIG. 11, among the components of an oscillator 10 described above and with reference to FIG. 1, illustration of components are omitted except for the first RC circuit 111, the second RC circuit 112, the first switching device 121, the second switching device 122, and the leakage current compensation circuit 160. In this example, it is assumed that a second latch signal LAT2 of a logic "high" level applied to the gate terminal of the fourth PMOS transistor MP4 of the second switching device 122 has the same magnitude as the supply voltage VDD.

Referring to FIG. 11, during the first RC circuit 111 charging process and the second RC circuit 112 discharging process, the third PMOS transistor MP3 and the third NMOS transistor MN3 of the first switching device 121 may be turned on, and the fourth PMOS transistor MP4 and the fourth NMOS transistor MN4 of the second switching device 122 may be turned off. Accordingly, a ramp current IRAMP from the supply voltage VDD terminal may flow to the output node NO through the first PMOS transistor MP1, the first resistor R1, and the first switching device 121. However, a portion of the ramp current IRAMP (hereinafter, referred to as "leakage current") may flow to the ground terminal through the second NMOS transistor MN2 of the second RC circuit 112 in the form of an off leakage current of the second switching device 122.

For the fourth PMOS transistor MP4 of the second switching device 122, a gate-source voltage of VOSC-VDD may be applied between the gate and source. Because the magnitude of the supply voltage VDD is greater than the magnitude of the oscillation voltage VOSC, a reverse bias may be applied between the gate terminal and the source terminal of the fourth PMOS transistor MP4. Accordingly, the leakage current through the fourth PMOS transistor MP4 may be very small, such as for example, at the level of several hundred pA. On the other hand, for the fourth NMOS transistor MN4 of the second switching device 122, a gate-source voltage of 0 V may be applied between the gate and source. In this case, the leakage current through the fourth NMOS transistor MN4 may correspond to the magnitude of the voltage between the drain terminal and the source terminal of the fourth NMOS transistor MN4. Because the drain-source voltage of the fourth NMOS transistor MN4 is the oscillation voltage VOSC, a large amount of leakage current may flow through the fourth NMOS transistor MN4. In particular, the amount of the leakage current in the second switching device 122 may be further increased when the fourth PMOS transistor MP4 and the fourth NMOS transistor MN4 constituting the second switching device 122 are configured to have LVT characteristics or ULVT characteristics for a fast switching operation.

In this way, in the process of charging the first RC circuit 111 and discharging the second RC circuit 112, as a large amount of leakage current ILK flows from the output node NO to the ground voltage terminal through the second switching device 122 in a turned-off state, the amount of the ramp current IRAMP in the first RC circuit 111 that generates the oscillation voltage VOSC at the output node NO may be decreased by the amount of the leakage current ILK. When the amount of the ramp current IRAMP is decreased, the time it takes for the voltage at the first node N1 of the first RC circuit 111 to be increased to the first oscillation voltage VOSC1 may be increased. That is, due to the leakage current ILK in the second switching device 122, the frequency of the oscillation voltage VOSC output from the oscillator 10 may become smaller (that is, the cycle may become longer).

The leakage current compensation circuit 160 of the relaxation oscillating circuit 100 may supply a leakage compensation current ICP to the output node NO, thereby preventing a frequency decrease due to the leakage current ILK flowing out from the output node NO through the second switching device 122. Specifically, because the gate terminal and source terminal of the fifth NMOS transistor MN5 of the leakage current compensation circuit 160 are short-circuited, the gate-source voltage of the fifth NMOS transistor MN5 may always be maintained at 0 V. Accordingly, the fifth NMOS transistor MN5 may be maintained in a turned-off state. That is, only the leakage compensation current ICP, which is the off leakage current, may flow from the drain terminal of the fifth NMOS transistor MN5 to the source terminal. The leakage compensation current ICP may have an amount corresponding to the drain-source voltage of the fifth NMOS transistor MN5, that is, the difference VDD-VOSC between the supply voltage VDD and the oscillation voltage VOSC. In an example, by appropriately adjusting the ratio (channel width/channel length) of the fifth NMOS transistor MN5 and fourth NMOS transistor MN4, the leakage compensation current ICP may have the same amount of current as the leakage current ILK flowing through the second switching device 122. The leakage compensation current ICP supplied to the output node NO from the leakage current compensation circuit 160 through the output line compensates for the decrease in the ramp current IRAMP due to the leakage current ILK at the output node NO.

Figure 12:
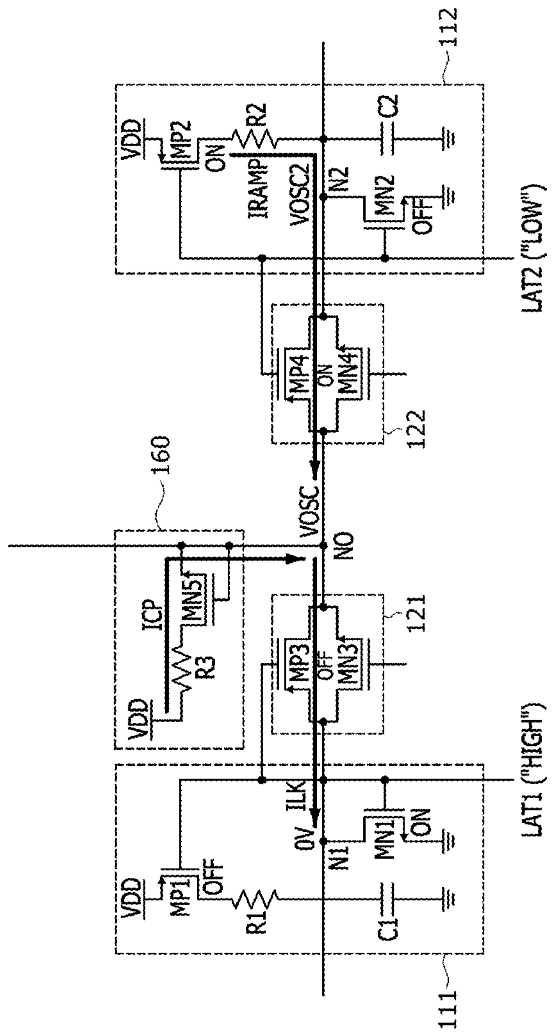
FIG. 12 is a diagram illustrating a phenomenon in which a leakage current is generated during an operation of an oscillator shown in FIG. 1 and another example of an operation of a leakage current compensation circuit to suppress the leakage current.

FIG. 12 illustrates a phenomenon in which a leakage current is generated during an operation of an oscillator shown in FIG. 1 and another example of an operation of a leakage current compensation circuit to suppress the leakage current. FIG. 12 omits the components of an oscillator 10 described with reference to FIG. 1, except for the first RC circuit 111, the second RC circuit 112, the first switching device 121, the second switching device 122, and the leakage current compensation circuit 160. In FIG. 12, the first latch signal LAT1 of a logic "high" level applied to the gate terminal of the third PMOS transistor MP3 of the first switching device 121 has the same magnitude as the supply voltage VDD. The drain and source of the MOS transistor are complementary, and accordingly, in FIG. 12, the drain terminals and the source terminals of the third PMOS transistor MP3 and the third NMOS transistor MN3 are shown as source terminals and drain terminals, respectively.

Referring to FIG. 12, the first RC circuit 111 performs a discharging process, the second RC circuit 112 performs a charging process, the third PMOS transistor MP3 and the third NMOS transistor MN3 of the first switching device 121 may be turned off, and the fourth PMOS transistor MP4 and the fourth NMOS transistor MN4 of the second switching device 122 may be turned on. Accordingly, the ramp current IRAMP from the supply voltage VDD terminal may flow to the output node NO through the second PMOS transistor MP2, the second resistor R2, and the second switching device 122. However, in the present example, the leakage current corresponding to a portion of the ramp current IRAMP may flow to the ground terminal through the first NMOS transistor MN1 of the first RC circuit 111 in the form of an off leakage current of the first switching device 121.

For the third PMOS transistor MP3 of the first switching device 121, a gate-source voltage of VOSC-VDD may be applied between the gate and source. Because the magnitude of the supply voltage VDD is greater than that of the oscillation voltage VOSC, a reverse bias may be applied between the gate terminal and the source terminal of the third PMOS transistor MP3. Accordingly, the leakage current through the third PMOS transistor MP3 may be very small, for example, at the level of several hundred pA. For the third NMOS transistor MN3 of the first switching device 121, a gate-source voltage of 0 V may be applied between the gate and source. In this case, the leakage current through the third NMOS transistor MN3 may correspond to the magnitude of voltage between the drain terminal and the source terminal of the third NMOS transistor MN3. Because the drain-source voltage of the third NMOS transistor MN3 is the oscillation voltage VOSC, a large amount of leakage current may flow through the third NMOS transistor MN3. In particular, the amount of the leakage current in the first switching device 121 may be further increased when the third PMOS transistor MP3 and the third NMOS transistor MN3 constituting the first switching device 121 are configured to have the LVT characteristics or the ULVT characteristics for a fast switching operation.

In the process of discharging the first RC circuit 111 and charging the second RC circuit 112, a large amount of leakage current ILK flows from the output node NO to the ground voltage terminal through the first switching device 121 in a turned-off state. The amount of the ramp current IRAMP in the second RC circuit 112 that generates the oscillation voltage VOSC at the output node NO may be decreased by the amount of the leakage current ILK. When the amount of the ramp current IRAMP is decreased, the time it takes for the voltage at the second node N2 of the second RC circuit 112 to be increased to the second oscillation voltage VOSC2 may be increased. That is, due to the leakage current ILK in the first switching device 121, the frequency of the oscillation voltage VOSC output from the oscillator 10 may become smaller (that is, the cycle may become longer).

The leakage current compensation circuit 160 may supply the leakage compensation current ICP to the output node NO, thereby preventing the frequency decrease due to the leakage current ILK flowing out from the output node NO through the first switching device 121. Specifically, because the gate terminal and source terminal of the fifth NMOS transistor MN5 of the leakage current compensation circuit 160 are short-circuited, the gate-source voltage of the fifth NMOS transistor MN5 may always be maintained at 0 V. Accordingly, the turned-off state of the fifth NMOS transistor MN5 may be maintained. That is, only the leakage compensation current ICP, which is the off leakage current, may flow from the drain terminal to the source terminal of the fifth NMOS transistor MN5. The leakage compensation current ICP may have an amount corresponding to the drain-source voltage of the fifth NMOS transistor MN5, that is, the difference VDD-VOSC between the supply voltage VDD and the oscillation voltage VOSC. In an example, by appropriately adjusting the ratio (channel width/channel length) of the fifth NMOS transistor MN5 and the third NMOS transistor MN3, the leakage compensation current ICP may be the same as the leakage current ILK flowing through the first switching device 121. The leakage compensation current ICP is supplied to the output node NO from the leakage current compensation circuit 160 through the output line to compensate for the decrease in the ramp current IRAMP by the leakage current ILK at the output node NO.

Figure 13:
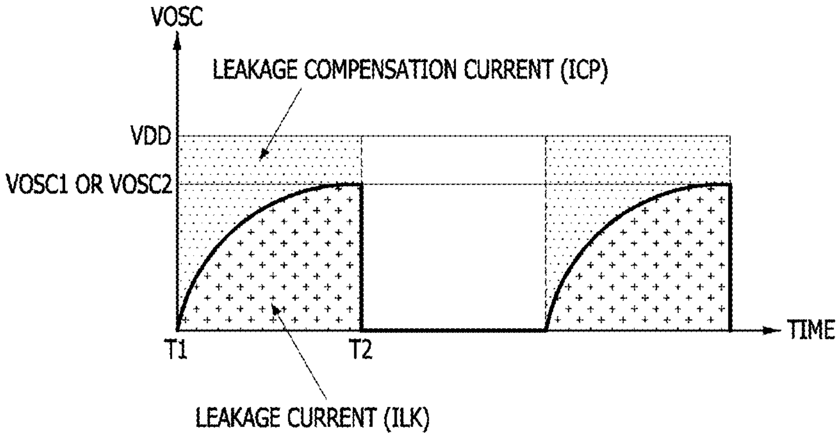
FIG. 13 is a waveform diagram illustrating the relationship between an oscillation signal output from an output node of a relaxation oscillating circuit included in an oscillator shown in FIG. 1, leakage current, and a leakage compensation current.

FIG. 13 is a waveform diagram illustrating the relationship between an oscillation signal output from an output node of a relaxation oscillation circuit included in an oscillator shown in FIG. 1, leakage current, and a leakage compensation current. The following description may apply both when a charging operation is performed in the first RC circuit 111 and a discharging operation is performed in the second RC circuit 112 between a first time point T1 and a second time point T2 and when a discharging operation is performed in the first RC circuit 111 and a charging operation is performed in the second RC circuit 112 between a first time point T1 and a second time point T2.

Referring to FIG. 13, between the first time point T1 and the second time point T2, when the first RC circuit 111 and the second RC circuit 112 perform a charging operation and a discharging operation, respectively, the oscillation voltage VOSC output from the output node NO of the relaxation oscillating circuit 100 may be the first oscillation voltage VOSC1, which is the voltage of the first node N1 of the first RC circuit 111. That is, from the first time point T1 at which the first capacitor C1 of the first RC circuit 111 begins to be charged to the second time point T2 at which charging of the first capacitor C1 is completed, the oscillation voltage VOSC from the output node NO may have a waveform that increases from 0 V to the first oscillation voltage VOSC1. In this process, as described with reference to FIG. 11, the leakage current ILK corresponding to the oscillation voltage VOSC may flow from the output node NO to the ground voltage terminal through the second switching device 122. Between the first time point T1 and the second time point T2, the leakage current compensation circuit 160 may supply the leakage compensation current ICP corresponding to the difference VDD-VOSC between the supply voltage VDD and the oscillation voltage VOSC to the output node NO.

Between the first time point T1 and the second time point T2, when the first RC circuit 111 and the second RC circuit 112 perform a discharging operation and a charging operation respectively, the oscillation voltage VOSC output from the output node NO of the relaxation oscillating circuit 100 may be the second oscillation voltage VOSC2, which is the voltage of the second node N2 of the second RC circuit 112. That is, from the first time point T1 at which the second capacitor C2 of the second RC circuit 112 begins to be charged to the second time point T2 at which charging of the second capacitor C2 is completed, the oscillation voltage VOSC from the output node NO may have a waveform that increases from 0 V to the second oscillation voltage VOSC2. In this process, as described with reference to FIG. 12, the leakage current ILK corresponding to the oscillation voltage VOSC may flow from the output node NO to the ground voltage terminal through the first switching device 121. Between the first time point T1 and the second time point T2, the leakage current compensation circuit 160 may supply the leakage compensation current ICP corresponding to the difference VDD-VOSC between the supply voltage VDD and the oscillation voltage VOSC to the output node NO.

Figure 14:
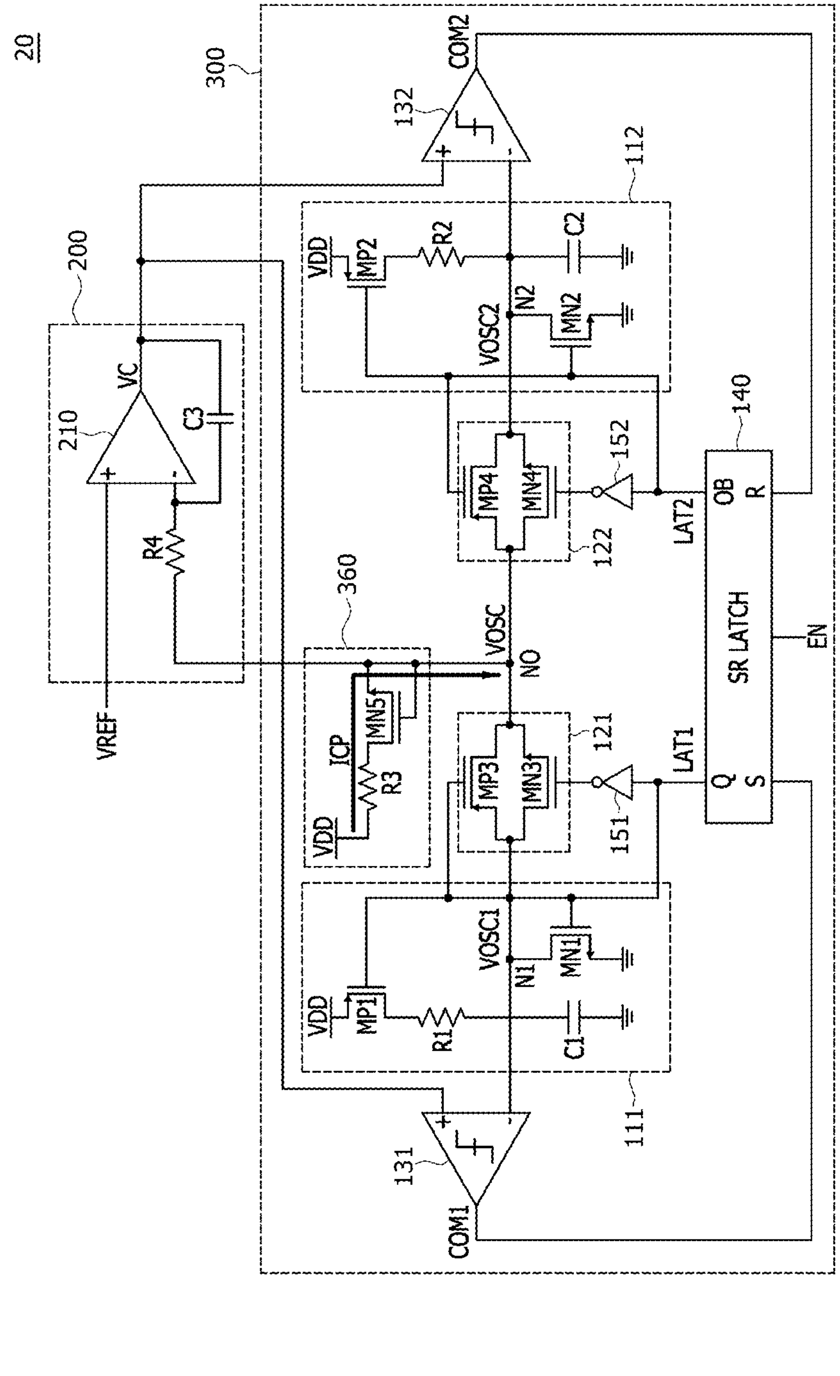
FIG. 14 is a circuit diagram illustrating an oscillator according to another embodiment of the present disclosure.

FIG. 14 is a circuit diagram illustrating an oscillator according to another embodiment of the present disclosure.

Referring to FIG. 14, an oscillator 20 may include a relaxation oscillating circuit 300 and a voltage averaging feedback circuit 200. The voltage averaging feedback circuit 200 is the same as described above with reference to FIG. 1, so redundant description will be omitted below. The relaxation oscillating circuit 300 may include a first RC circuit 111, a second RC circuit 112, a first switching device 121, a second switching device 122, a first comparator 131, a second comparator 132, a latch circuit 140, a first inverter 151, a second inverter 152, and a leakage current compensation circuit 360. The first RC circuit 111, the second RC circuit 112, the first switching device 121, the second switching device 122, the first comparator 131, the second comparator 132, the latch circuit 140, the first inverter 151, and the second inverter 152 may be the same as described above with reference to FIG. 1.

The leakage current compensation circuit 360 may be different from the leakage current compensation circuit (160 in FIG. 1) included in the oscillator (10 in FIG. 1) of FIG. 1. Both circuits receive a supply voltage VDD but the leakage current compensation circuit 360 receives a control voltage VC output from the voltage averaging feedback circuit 200. That is, a leakage compensation current ICP provided from the leakage current compensation circuit 360 to an output node NO may be generated by the difference between control voltage VC and oscillation voltage VOSC, which is the drain-source voltage of a fifth NMOS transistor MN5. A peak value of an oscillation voltage VOSC may vary depending on the process-voltage-temperature (hereinafter, referred to as "PVT") variation. The control voltage VC provided from the voltage averaging feedback circuit 200 has a value similar to the peak value of the oscillation voltage VOSC, so the leakage compensation current ICP may change in peak value according to the PVT variation that varies the oscillation voltage VOSC.

Figure 15:
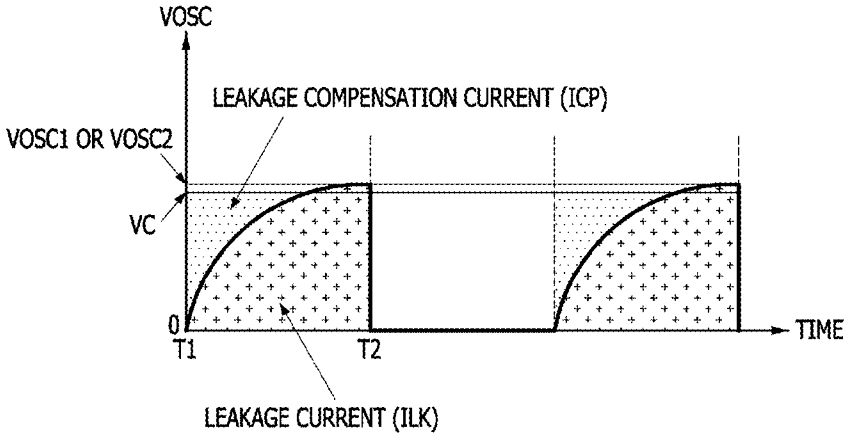
FIG. 15 is a waveform diagram illustrating a relationship between an oscillation signal output from an output node of a relaxation oscillating circuit included in an oscillator shown in FIG. 14, a leakage current, and a leakage compensation current.

FIG. 15 is a waveform diagram illustrating a relationship between an oscillation signal output from an output node of a relaxation oscillating circuit included in an oscillator shown in FIG. 14, a leakage current, and a leakage compensation current. The following description may apply both when a charging operation is performed in the first RC circuit 111 and a discharging operation is performed in the second RC circuit 112 between a first time point T1 and a second time point T2 and when a discharging operation is performed in the first RC circuit 111 and a charging operation is performed in the second RC circuit 112 between a first time point T1 and a second time point T2.

Referring to FIG. 15, between the first time point T1 and the second time point T2, when the first RC circuit 111 and the second RC circuit 112 perform the charging operation and discharging operation respectively, the oscillation voltage VOSC output from the output node NO of the relaxation oscillating circuit 300 may be the first oscillation voltage VOSC1, which is the voltage of a first node N1 of the first RC circuit 111. That is, from the first time point T1 at which a first capacitor C1 of the first RC circuit 111 begins to be charged to the second time point T2 at which the charging of the first capacitor C1 is completed, the oscillation voltage VOSC from the output node NO may have a waveform that increases from 0 V to the first oscillation voltage VOSC1. In this process, as described with reference to FIG. 11, the leakage current ILK corresponding to the oscillation voltage VOSC may flow from the output node NO to the ground voltage terminal through the second switching device 122. Between the first time point T1 and the second time point T2, the leakage current compensation circuit 360 may supply the leakage compensation current ICP corresponding to the difference VDD-VOSC of the supply voltage VDD and the oscillation voltage VOSC to the output node NO. As described with reference to FIG. 14, the control voltage VC may have a magnitude similar to the peak value of the oscillation voltage VOSC.

Between the first time point T1 and the second time point T2, when the first RC circuit 111 and the second RC circuit 112 perform the discharging operation and charging operation respectively, the oscillation voltage VOSC output from the output node NO of the relaxation oscillating circuit 300 may be the second oscillation voltage VOSC2, which is the voltage of the second node N2 of the second RC circuit 112. That is, from the first time point T1 at which a second capacitor C2 of the second RC circuit 112 begins to be charged to the second time point T2 at which charging of the second capacitor C2 is completed, the oscillation voltage VOSC from the output node NO may have a waveform that increases from 0 V to the second oscillation voltage VOSC2. In this process, as described with reference to FIG. 12, the leakage current ILK corresponding to the oscillation voltage VOSC may flow from the output node NO to the ground voltage terminal through the first switching device 121. Between the first time point T1 and the second time point T2, the leakage current compensation circuit 360 may supply the leakage compensation current ICP corresponding to (VC-VOSC) to the output node NO.

Figure 16:
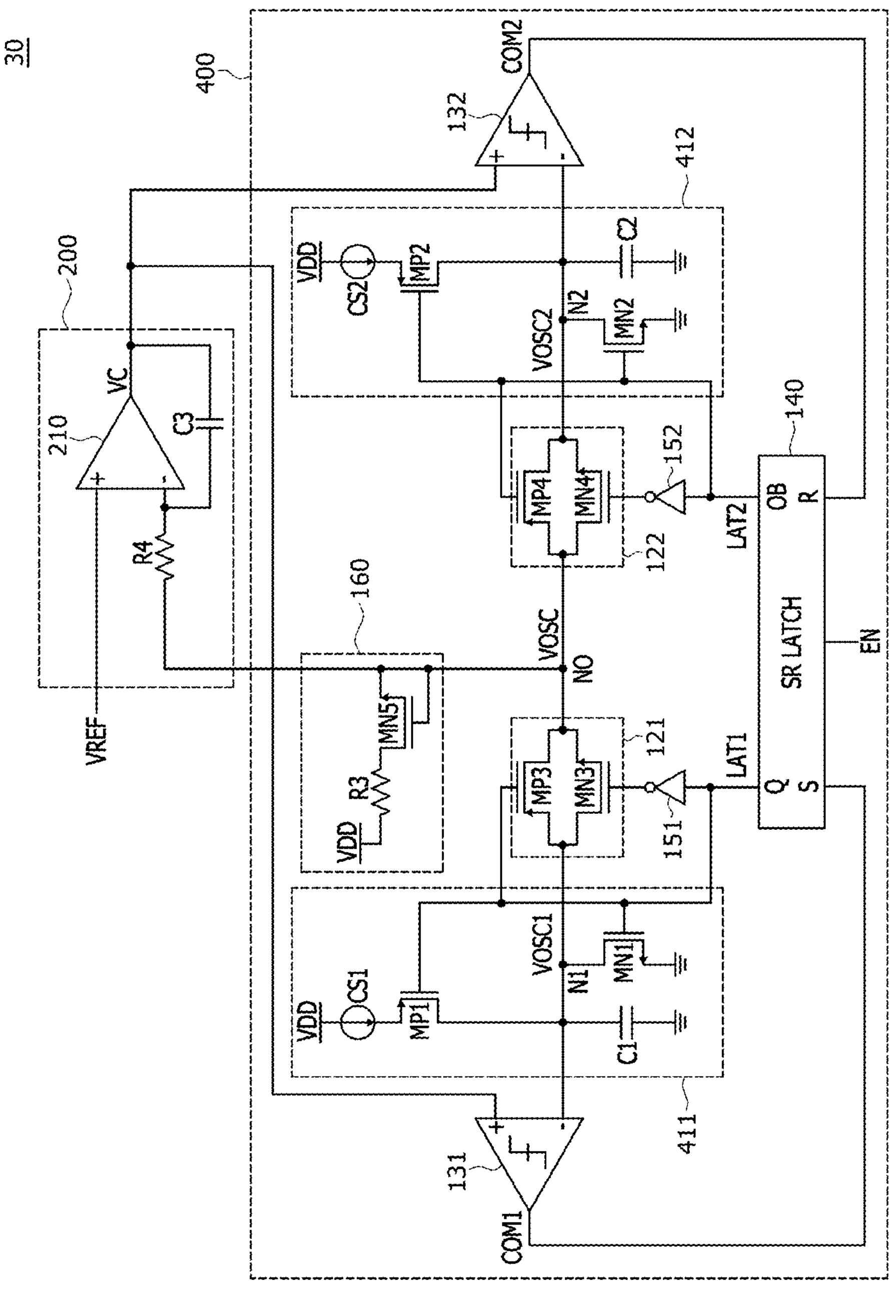
FIG. 16 is a circuit diagram illustrating an oscillator according to yet another embodiment of the present disclosure.

FIG. 16 is a circuit diagram illustrating an oscillator according to yet another embodiment of the present disclosure.

Referring to FIG. 16, an oscillator 30 may include a relaxation oscillating circuit 400 and a voltage averaging feedback circuit 200. The voltage averaging feedback circuit 200 is the same as that described above with reference to FIG. 1, so a redundant description will be omitted below. The relaxation oscillating circuit 400 may include a first capacitor circuit 411, a second capacitor circuit 412, a first switching device 121, a second switching device 122, a first comparator 131, a second comparator 132, a latch circuit 140, a first inverter 151, a second inverter 152, and a leakage current compensation circuit 160. The first switching device 121, the second switching device 122, the first comparator 131, the second comparator 132, the latch circuit 140, the first inverter 151, the second inverter 152, and the leakage current compensation circuit 160 may be the same as components described above with reference to FIG. 1. The relaxation oscillating circuit 400 in FIG. 16 may be different from the relaxation oscillating circuit (100 in FIG. 1) of the oscillator (10 in FIG. 1), in that the relaxation oscillating circuit (100 in FIG. 1) includes a first RC circuit (111 in FIG. 1) and a second RC circuit (112 in FIG. 1) while the relaxation oscillating circuit 400 of the oscillator 30 includes the first capacitor circuit 411 and the second capacitor circuit 412.

The first capacitor circuit 411 may include a first current source CS1, a first capacitor C1, a first PMOS transistor MP1, and a first NMOS transistor MN1. The first current source CS1 may be coupled to a supply voltage VDD terminal to which the supply voltage VDD is applied through an input terminal, and may be coupled to a source terminal of the first PMOS transistor MP1 through an output terminal. A drain terminal of the first PMOS transistor MP1 may be coupled to a first node N1. A gate terminal of the first PMOS transistor MP1 may be coupled to a first output terminal Q of the latch circuit 140. The first capacitor C1 may be coupled to the first node N1 and a ground voltage terminal. A drain terminal and a source terminal of the first NMOS transistor MN1 may be coupled to the first node N1 and the ground voltage terminal, respectively. A gate terminal of the first NMOS transistor MN1 may be coupled to the first output terminal Q of the latch circuit 140.

When a first latch signal LAT1 of a logic "low" level is applied to the gate terminal of the first PMOS transistor MP1 and the gate terminal of the first NMOS transistor MN1, the first capacitor circuit 411 may perform a charging operation. A third PMOS transistor MP3 and a third NMOS transistor MN3 of the first switching device 121 may be turned on while the first capacitor circuit 411 performs the charging operation. As a current from the first current source CS1 flows into the first capacitor C1 through the first PMOS transistor MP1, the first capacitor C1 may be charged, and a voltage at the first node N1 may be pulled-up to a first oscillation voltage VOSC1. Because the first switching device 121 is in a turned-on state, the first oscillation voltage VOSC1 at the first node N1 may be applied to an output node NO. The first oscillation voltage VOSC1 may be output as an oscillation voltage VOSC through an output line of the relaxation oscillating circuit 400. While the first capacitor circuit 411 performs the charging operation as described above with reference to FIG. 11, the leakage current compensation circuit 160 may provide a leakage compensation current to the output node NO.

When the first latch signal LAT1 of a logic "high" level is applied to the gate terminal of the first PMOS transistor MP1 and the gate terminal of the first NMOS transistor MN1, the first capacitor circuit 411 may perform a discharging operation. The third PMOS transistor MP3 and the third NMOS transistor MN3 of the first switching device 121 may be turned off while the first capacitor circuit 411 performs the discharging operation. Because the first switching device 121 is in a turned-off state, the first capacitor C1 may discharge electric charges to the ground voltage terminal through the first NMOS transistor MN1. Accordingly, the voltage at the first node N1 may be pulled-down from the first oscillation voltage VOSC1 until the voltage reaches 0 V.

The second capacitor circuit 412 may include a second current source CS2, a second capacitor C2, a second PMOS transistor MP2, and a second NMOS transistor MN2. The second current source CS2 may be coupled to the supply voltage VDD terminal to which the supply voltage VDD is applied through an input terminal, and may be coupled to a source terminal of the second PMOS transistor MP2 through an output terminal. A drain terminal of the second PMOS transistor MP2 may be coupled to a second node N2. A gate terminal of the second PMOS transistor MP2 may be coupled to a second output terminal QB of the latch circuit 140. The second capacitor C2 may be coupled to the second node N2 and the ground voltage terminal. A drain terminal and a source terminal of the second NMOS transistor MN2 may be coupled to the second node N2 and the ground voltage terminal, respectively. A gate terminal of the second NMOS transistor MN2 may be coupled to the second output terminal QB of the latch circuit.

When a second latch signal LAT2 of a logic "low" level is applied to the gate terminal of the second PMOS transistor MP2 and the gate terminal of the second NMOS transistor MN2, the second capacitor circuit 412 may perform a charging operation. While the second capacitor circuit 412 performs the charging operation, a fourth PMOS transistor MP4 and a fourth NMOS transistor MN4 of the second switching device 122 may be turned on. As current from the second current source CS2 flows into the second capacitor C2 through the second PMOS transistor MP2, the second capacitor C2 may be charged, and the voltage at the second node N2 may be pulled-up to a second oscillation voltage VOSC2. Because the second switching device 122 is in a turned-on state, the second oscillation voltage VOSC2 at the second node N2 may be applied to the output node NO. The second oscillation voltage VOSC2 may be output as the oscillation voltage VOSC through the output line of the relaxation oscillating circuit 400. While the second capacitor circuit 412 performs the charging operation as described above with reference to FIG. 12, the leakage current compensation circuit 160 may provide a leakage compensation current to the output node NO.

When the second latch signal LAT2 of a logic "high" level is applied to the gate terminal of the second PMOS transistor MP2 and the gate terminal of the second NMOS transistor MN2, the second capacitor circuit 412 may perform a discharging operation. While the second capacitor circuit 412 performs the discharging operation, the fourth PMOS transistor MP4 and the fourth NMOS transistor MN4 of the second switching device 122 may be turned off. Because the second switching device 122 is in a turned-off state, the second capacitor C2 may discharge electric charges to the ground voltage terminal through the second NMOS transistor MN2. Accordingly, the voltage at the second node N2 may be pulled-down from the second oscillation voltage VOSC2 until the voltage reaches 0 V.

Figure 17:
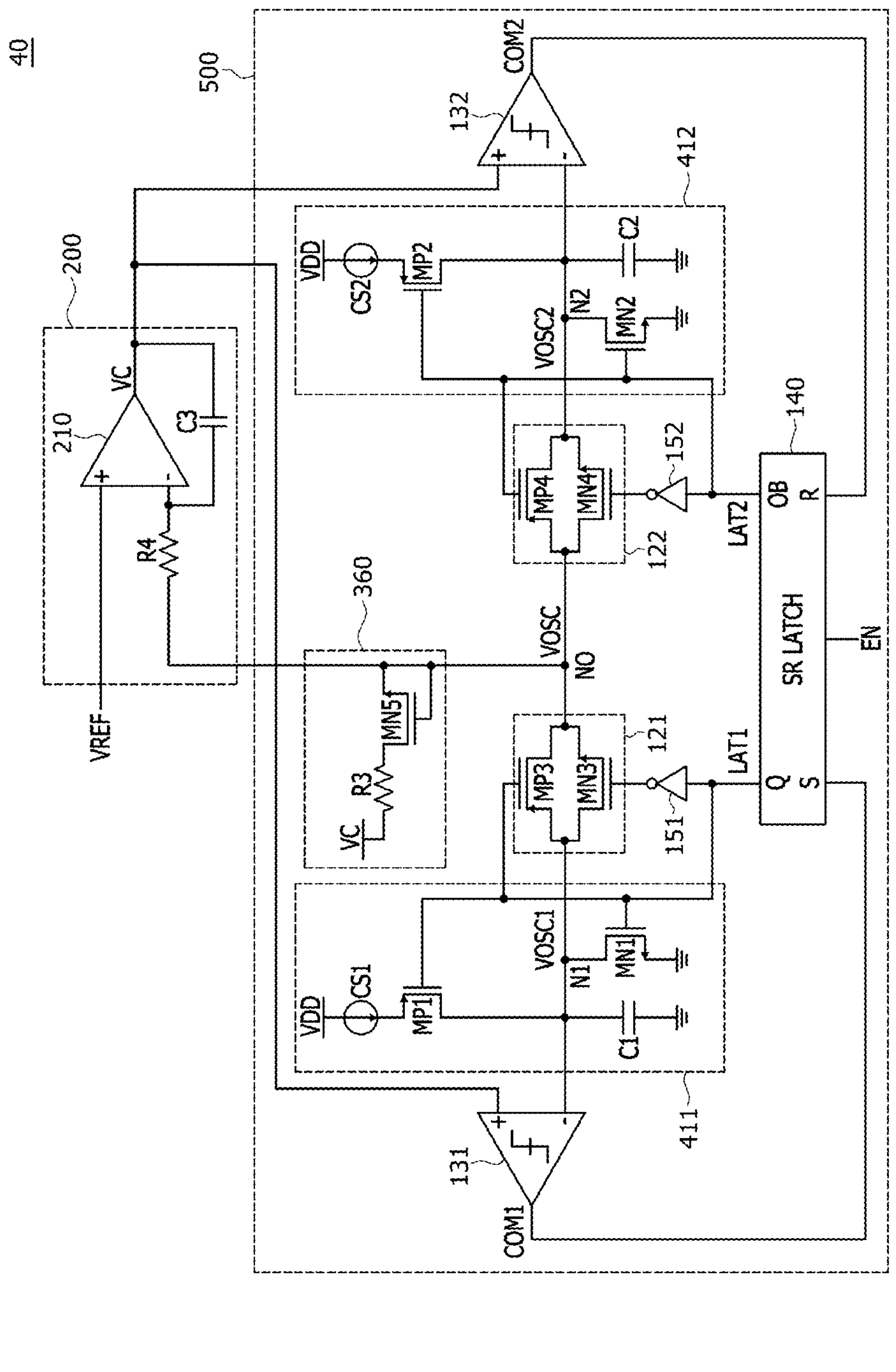
FIG. 17 is a circuit diagram illustrating an oscillator according to still another embodiment of the present disclosure.

FIG. 17 is a circuit diagram illustrating an oscillator according to still another embodiment of the present disclosure.

Referring to FIG. 17, an oscillator 40 may include a relaxation oscillating circuit 500 and a voltage averaging feedback circuit 200. The voltage average feedback circuit 200 is the same circuit as described with reference to FIG. 1, so a redundant description will be omitted below. The relaxation oscillating circuit 500 may include a first capacitor circuit 411, a second capacitor circuit 412, a first switching device 121, a second switching device 122, a first comparator 131, a second comparator 132, a latch circuit 140, a first inverter 151, a second inverter 152, and a leakage current compensation circuit 360. The first switching device 121, the second switching device 122, the first comparator 131, the second comparator 132, the latch circuit 140, the first inverter 151, and the second inverter 152 may be the same as described above and with reference to FIG. 1. The first capacitor circuit 411 and the second capacitor circuit 412 may be the same as described above with reference to FIG. 16. In addition, the leakage current compensation circuit 360 may be the same as described above with reference to FIG. 14. That is, the relaxation oscillating circuit 500 of the oscillator 40 according to the present disclosure may be different from the relaxation oscillating circuit 100 of the oscillator 10 described above and with reference to FIG. 1, in that the relaxation oscillating circuit 100 in FIG. 1 includes a first RC circuit 111 and a second RC circuit 112 while the relaxation oscillating circuit 500 of the oscillator 40 includes a first capacitor circuit 411 and a second capacitor circuit 412. In addition, the leakage current compensation circuit 360 included in the relaxation oscillating circuit 500 of the oscillator 40 may be different from the leakage current compensation circuit 160 included in the oscillator 30 of FIG. 16. The leakage current compensation circuit 160 receives a supply voltage VDD, while the leakage current compensation circuit 360 included in the relaxation oscillating circuit 500 receives a control voltage VC output from the voltage averaging feedback circuit 200.

As described with reference to FIG. 14, a leakage compensation current ICP provided from a leakage current compensation circuit 360 may be generated by a drain-source voltage (control voltage VC-oscillation voltage VOSC) of a fifth NMOS transistor MN5. The peak value of the oscillation voltage VOSC may vary depending on the process-voltage-temperature (PVT) variation. The control voltage VC provided from the voltage averaging feedback circuit 200 has a value similar to the peak value of the oscillation voltage VOSC, so the leakage compensation current ICP may correspond to a change in the peak value of the oscillation voltage VOSC, which may depend on PVT variation.

Figure 18:
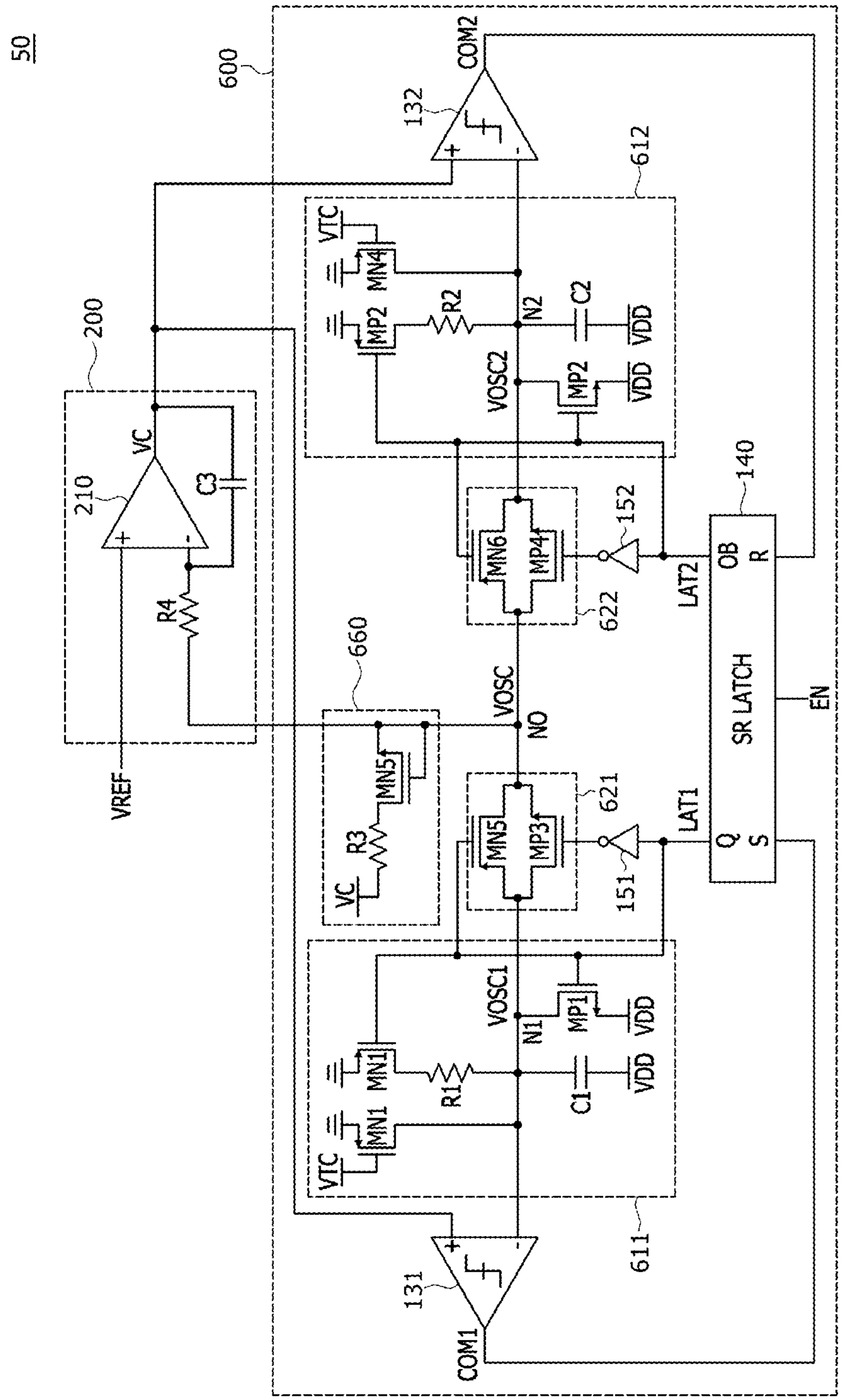
FIG. 18 is a circuit diagram illustrating an oscillator according to a further embodiment of the present disclosure.

FIG. 18 is a circuit diagram illustrating an oscillator according to a further embodiment of the present disclosure.

Referring to FIG. 18, an oscillator 50 may include a relaxation oscillating circuit 600 and a voltage averaging feedback circuit 200. The voltage averaging feedback circuit 200 is the same as that described above with reference to FIG. 1, so a redundant description will be omitted below. The relaxation oscillating circuit 600 may include a first RC circuit 611, a second RC circuit 612, a first switching device 621, a second switching device 622, a first comparator 131, a second comparator 132, a latch circuit 140, a first inverter 151, a second inverter 152, and a leakage current compensation circuit 660. The first comparator 131, the second comparator 132, the latch circuit 140, the first inverter 151, and the second inverter 152 may be the same as that described above and with reference to FIG. 1.

The first RC circuit 611 may include a first NMOS transistor MN1, a first resistor R1, a second NMOS transistor MN2, a first capacitor C1, and a first PMOS transistor MP1. A source terminal of the first NMOS transistor MN1 may be coupled to the ground voltage terminal. A drain terminal of the first NMOS transistor MN1 may be coupled to the first resistor R1. A gate terminal of the first NMOS transistor MN1 may be coupled to a first output terminal Q of the latch circuit 140. One terminal of the first resistor R1 may be coupled to the drain terminal of the first NMOS transistor MN1. The other terminal of the first resistor R1 may be coupled to a first node N1. A source terminal of the second NMOS transistor MN2 may be coupled to the ground voltage terminal. A drain terminal of the second NMOS transistor MN2 may be coupled to the first node N1. A temperature compensation voltage VTC may be applied to a gate terminal of the second NMOS transistor MN2. One terminal of the first capacitor C1 may be coupled to the first node N1. The other terminal of the first capacitor C1 may be coupled to the supply voltage VDD terminal. A drain terminal of the first PMOS transistor MP1 may be coupled to the first node N1. A source terminal of the first PMOS transistor MP1 may be coupled to the supply voltage VDD terminal. A gate terminal of the first PMOS transistor MP1 may be coupled to the first output terminal Q of the latch circuit 140.

The second RC circuit 612 may include a third NMOS transistor MN3, a second resistor R2, a fourth NMOS transistor MN4, a second capacitor C2, and a second PMOS transistor MP2. A source terminal of the third NMOS transistor MN3 may be coupled to the ground voltage terminal. A drain terminal of the third NMOS transistor MN3 may be coupled to the second resistor R2. A gate terminal of the third NMOS transistor MN3 may be coupled to a second output terminal QB of the latch circuit 140. One terminal of the second resistor R2 may be coupled to the drain terminal of the third NMOS transistor MN3. The other terminal of the second resistor R2 may be coupled to a second node N2. A source terminal of the fourth NMOS transistor MN4 may be coupled to the ground voltage terminal. A drain terminal of the fourth NMOS transistor MN4 may be coupled to the second node N2. A temperature compensation voltage VTC may be applied to a gate terminal of the fourth NMOS transistor MN4. One terminal of the second capacitor C2 may be coupled to the second node N2. The other terminal of the second capacitor C2 may be coupled to the supply voltage VDD terminal. A drain terminal of the second PMOS transistor MP2 may be coupled to the second node N2. A source terminal of the second PMOS transistor MP2 may be coupled to the supply voltage VDD terminal. A gate terminal of the second PMOS transistor MP2 may be coupled to the second output terminal QB of the latch circuit 140.

The first capacitor C1 of the first RC circuit 611 is coupled to the supply voltage VDD terminal, so the first capacitor C1 may be in a charged state. Accordingly, a first oscillation voltage VOSC1 may be applied to the first node N1. Similarly, the second capacitor C2 of the second RC circuit 612 is coupled to the supply voltage VDD terminal, so the second capacitor C2 may also be charged in an initial state, and accordingly, a second oscillation voltage VOSC2 may be applied to the second node N2. The first oscillation voltage VOSC1 at the first node N1 and the second oscillation voltage VOCS2 at the second node N2 may each have substantially the same magnitude as the supply voltage VDD.

The first switching device 621 may be a transmission gate including a third PMOS transistor MP3 and a fifth NMOS transistor MN5. A gate terminal of the third PMOS transistor MP3 may be coupled to an output terminal of the first inverter 151. A source terminal and a drain terminal (or the drain terminal and the source terminal) of the third PMOS transistor MP3 may be coupled to the first node N1 and an output node NO, respectively. A gate terminal of the fifth NMOS transistor MN5 may be coupled to the first output terminal Q of the latch circuit 140. A drain terminal and a source terminal (or the source terminal and the drain terminal) of the fifth NMOS transistor MN5 may be coupled to the first node N1 and the output node NO, respectively.

The second switching device 622 may be a transmission gate including a fourth PMOS transistor MP4 and a sixth NMOS transistor MN6. A gate terminal of the fourth PMOS transistor MP4 may be coupled to an output terminal of the second inverter 152. A source terminal and a drain terminal (or the drain terminal and the source terminal) of the fourth PMOS transistor MP4 may be coupled to the second node N2 and the output node NO, respectively. A gate terminal of the sixth NMOS transistor MN6 may be coupled to the second output terminal QB of the latch circuit 140. A drain terminal and a source terminal (or the source terminal and the drain terminal) of the sixth NMOS transistor MN6 may be coupled to the second node N2 and the output node NO, respectively.

The leakage current compensation circuit 660 may include a fifth PMOS transistor MP5 and a third resistor R3. A gate terminal and a source terminal of the fifth PMOS transistor MP5 may be coupled to an output line from the output node NO. Because the gate terminal and source terminal of the fifth PMOS transistor MP5 are short-circuited, the fifth PMOS transistor MP5 may maintain a turned-off state. A drain terminal of the fifth PMOS transistor MP5 may be coupled to one terminal of the third resistor R3. The other terminal of the third resistor R3 may be coupled to the output line of the voltage averaging feedback circuit 200. Accordingly, the control voltage VC output from the voltage averaging feedback circuit 200 may be applied to the other terminal of the third resistor R3. In another embodiment, the leakage current compensation circuit 660 might not include the third resistor R3. In this case, the control voltage VC may be applied to the drain terminal of the fifth PMOS transistor MP5.

Figure 19:
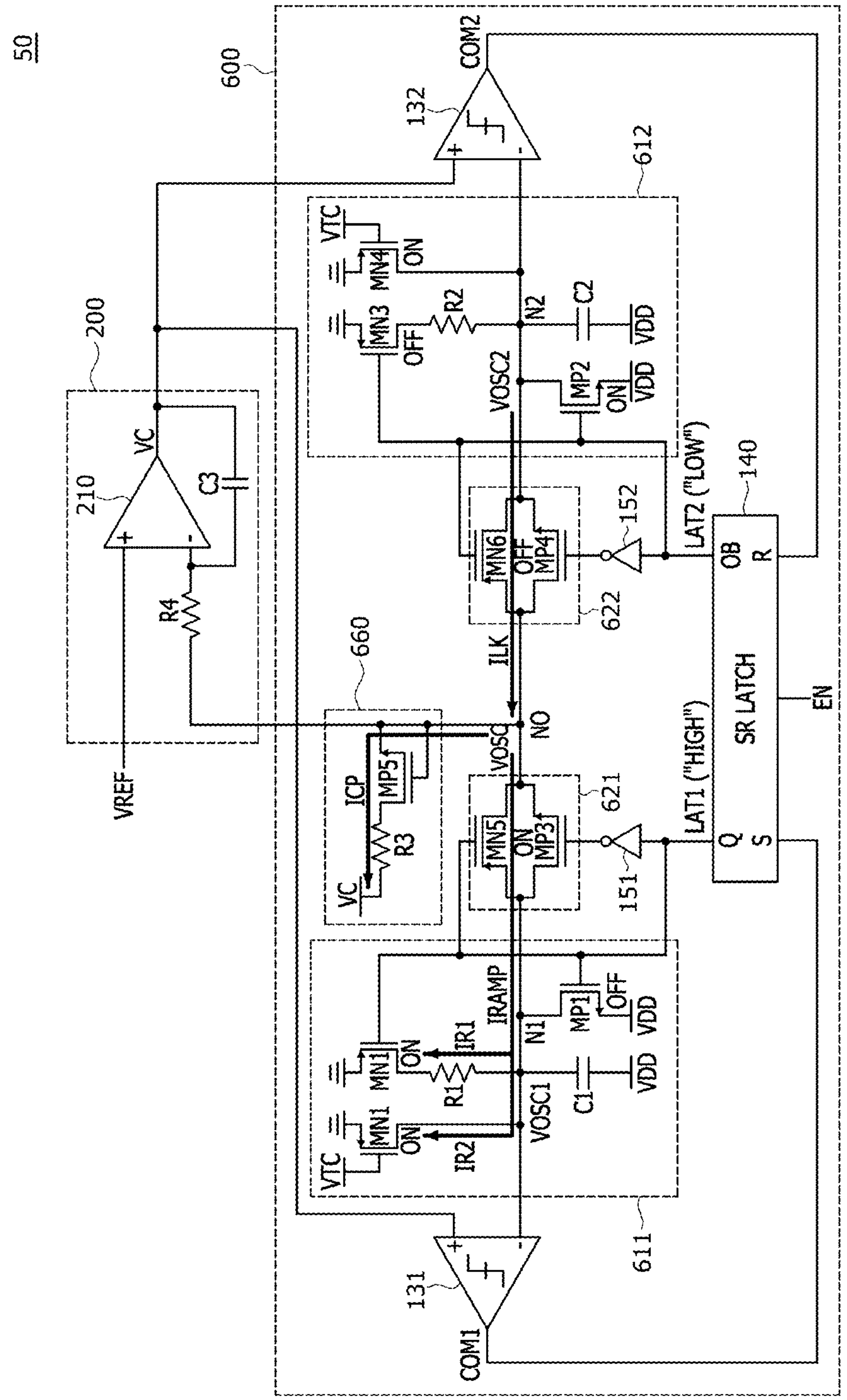
FIG. 19 is a circuit diagram illustrating an operation of an oscillator illustrated in FIG. 18.

FIG. 19 is a circuit diagram illustrating an operation of an oscillator illustrated in FIG. 18. In FIG. 19, the same reference numerals as used in FIG. 18 indicate the same components.

Referring to FIG. 19, when a first latch signal LAT1 of a logic "high" level and a second latch signal LAT2 of a logic "low" level are output through the first output terminal Q and the second output terminal QB of a latch circuit 140, respectively, the first RC circuit 611 may perform a discharging process and the second RC circuit 612 may perform a charging process. In addition, the third PMOS transistor MP3 and the fifth NMOS transistor MN5 of the first switching device 621 may be turned on, and the fourth PMOS transistor MP4 and the sixth NMOS transistor MN6 of the second switching device 622 may be turned off. Accordingly, the oscillation voltage VOSC of the output node NO may become equal to the first oscillation voltage VOSC1 at the first node N1.

Although not illustrated in FIG. 19, when the first latch signal LAT1 of a logic "low" level and the second latch signal LAT2 of a logic "high" level are output through the first output terminal Q and the second output terminal QB of the latch circuit 140, respectively, the first RC circuit 611 may perform a charging process and the second RC circuit 612 may perform a discharging process. In addition, the third PMOS transistor MP3 and the fifth NMOS transistor MN5 of the first switching device 621 may be turned off, and the fourth PMOS transistor MP4 and the sixth NMOS transistor MN6 of the second switching device 622 may be turned on. Accordingly, the oscillation voltage VOSC at the output node NO may become equal to the second oscillation voltage VOSC2 at the second node N2.

When the first RC circuit 611 performs the discharging process and the second RC circuit 612 performs the charging process, that is, when the first latch signal LAT1 of a logic "high" level and the second latch signal LAT2 of a logic "low" level are output through the first output terminal Q and the second output terminal QB of the latch circuit 140, respectively, the first NMOS transistor MN1 and the first PMOS transistor MP1 of the first RC circuit 611 may be turned on and turned off, respectively. On the other hand, the third NMOS transistor MN3 and the second PMOS transistor MP2 of the second RC circuit 612 may be turned off and turned on, respectively. The second NMOS transistor MN2 of the first RC circuit 611 and the fourth NMOS transistor MN4 of the second RC circuit 612 may both be turned on as the temperature compensation voltage VTC is applied to the gate terminals.

Due to the first oscillation voltage VOSC1 at the first node N1 of the first RC circuit 611, a ramp current IRAMP may be divided into a first ramp current IR1 and a second ramp current IR2 through a first path and a second path, respectively, and flow to the ground voltage terminal. As a result, the voltage at the first node N1 of the first RC circuit 611 may be pulled-down from the first oscillation voltage VOSC1 until the voltage reaches 0 V. Here, the first path may be a path from the first node N1 through the first resistor R1 and the first NMOS transistor MN1, and the second path may be a path through the second NMOS transistor MN2. The temperature compensation voltage VTC applied to the gate terminal of the second NMOS transistor MN2 may vary in magnitude such that the amount of the second ramp current IR2 decreases in proportion to the increase in the first ramp current IR1, while the sum of the first ramp current IR1 and the second ramp current IR2 remains equal to the amount of the ramp current IRAMP. Accordingly, when the amount of the first ramp current IR1 is equal to the amount of the ramp current IRAMP, the second NMOS transistor MN2 of the first RC circuit 611 and the fourth NMOS transistor MN4 of the second RC circuit 612 may be turned off.

While the first RC circuit 611 performs a discharging process, the second RC circuit 612 may perform a charging process. Specifically, as the second latch signal LAT2 of a logic "low" level is output through the second output terminal QB of the latch circuit 140, the second PMOS transistor MP2 of the second RC circuit 612 may be turned on, and the third NMOS transistor MN3 may be turned off. In addition, the fourth PMOS transistor MP4 and the sixth NMOS transistor MN6 of the second switching device 622 may be turned off. The fourth NMOS transistor MN4 of the second RC circuit 612 may be turned on as the temperature compensation voltage VTC is applied to the gate terminal. Under such conditions, the voltage at the second node N2 of the second RC circuit 612 may be pulled-up to the second oscillation voltage VOSC2.

In this way, when the first RC circuit 611 performs a discharging process and the second RC circuit 612 performs a charging process, a leakage current ILK may flow from the second node N2 to the output node NO through the second switching device 622, which is in a turned-off state. Specifically, the gate-source voltage of the sixth NMOS transistor MN6 may be 0 V, and accordingly, an off leakage current corresponding to the drain-source voltage of the sixth NMOS transistor MN6 may be generated. The leakage current ILK may increase the amount of the ramp current IRAMP from the output node NO to the first node N1, and as a result, the time required for the discharging process in the first RC circuit 611 increases.

In order to suppress problems caused by the leakage current ILK, the leakage current compensation circuit 660 may generate a leakage compensation current ICP flowing out from the output node NO to the control voltage VC terminal. Specifically, because the gate terminal and source terminal of the fifth PMOS transistor MP5 included in the leakage current compensation circuit 660 are short-circuited, the fifth PMOS transistor MP5 may be maintained in a turned-off state. The gate-source voltage of the fifth PMOS transistor MP5 is 0 V, and accordingly, an off leakage current, that is, the leakage compensation current ICP may flow from the source terminal to the drain terminal of the fifth PMOS transistor MP5. The leakage compensation current ICP may be generated in response to the source-drain voltage of the fifth PMOS transistor MP5, that is, the difference between the oscillation voltage VOSC and the control voltage VC.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An oscillator comprising:

a relaxation oscillating circuit including a first resistor-capacitor (RC) circuit generating a first oscillation voltage at a first node and a second RC circuit generating a second oscillation voltage at a second node, and configured to output an oscillation voltage through an output line coupled to an output node; and a voltage averaging feedback circuit configured to receive a reference voltage and the oscillation voltage to output a control voltage through an output terminal, wherein the relaxation oscillating circuit includes a leakage current compensation circuit coupled to the output line and configured to provide a leakage compensation current to the output node.

2. The oscillator of claim 1, wherein the first RC circuit includes:

a first MOS transistor coupled to a supply voltage terminal to which a supply voltage is applied;

a first resistor coupled to the first MOS transistor and the first node;

a first capacitor between the first node and a ground voltage terminal to which a ground voltage is applied; and a second MOS transistor coupled to the first capacitor in parallel between the first node and the ground voltage terminal, and wherein the second RC circuit includes:

a third MOS transistor coupled to the supply voltage terminal;

a second resistor coupled to the third MOS transistor and the second node;

a second capacitor between the second node and the ground voltage terminal; and a fourth MOS transistor coupled to the second capacitor in parallel between the second node and the ground voltage terminal.

3. The oscillator of claim 2, wherein the relaxation oscillating circuit further includes:

a first switching device coupled to the first node and the output node; and a second switching device coupled to the second node and the output node, and wherein the first switching device and the second switching device perform switching operations so that the first oscillation voltage and the second oscillation voltage are alternately output through the output line coupled to the output node.

4. The oscillator of claim 3, wherein the relaxation oscillating circuit further includes:

a first comparator configured to compare the control voltage and the first oscillation voltage at the first node to output a first comparison signal;

a second comparator configured to compare the control voltage and the second oscillation voltage at the second node to output a second comparison signal; and a latch circuit configured to receive the first comparison signal and the second comparison signal to output a first latch signal and a second latch signal for alternately turning on the first switching device and the second switching device.

5. The oscillator of claim 4, wherein the first switching device is a first transmission gate including a first P-channel type MOS (PMOS) transistor and a first N-channel type MOS (NMOS) transistor, and wherein the second switching device is a second transmission gate including a second PMOS transistor and a second NMOS transistor.

6. The oscillator of claim 5, wherein a gate terminal of the first PMOS transistor receives the first latch signal, wherein a gate terminal of the first NMOS transistor receives an inverted signal of the first latch signal, wherein a gate terminal of the second PMOS transistor receives the second latch signal, and wherein a gate terminal of the second NMOS transistor receives an inverted signal of the second latch signal.

7. The oscillator of claim 5, wherein each of the first PMOS transistor, the first NMOS transistor, the second PMOS transistor, and the second NMOS transistor has low voltage threshold (LVT) characteristics or ultra-high voltage threshold (ULVT) characteristics.

8. The oscillator of claim 2, wherein the leakage current compensation circuit includes an N-channel type MOS (NMOS) transistor coupled to the supply voltage terminal and the output line, and wherein a drain terminal of the NMOS transistor is coupled to the supply voltage terminal, and a gate terminal and a source terminal of the NMOS transistor are coupled to the output line.

9. The oscillator of claim 8, wherein the leakage current compensation circuit further includes a resistor coupled to the supply voltage terminal and the drain terminal of the NMOS transistor.

10. The oscillator of claim 1, wherein the leakage current compensation circuit includes an N-channel type MOS (NMOS) transistor coupled to the output terminal of the voltage averaging feedback circuit and the output line, and wherein a drain terminal of the NMOS transistor is coupled to the output terminal of the voltage averaging feedback circuit, and a gate terminal and a source terminal of the NMOS transistor are coupled to the output line.

11. The oscillator of claim 10, wherein the leakage current compensation circuit further includes a resistor coupled to the output terminal of the voltage averaging feedback circuit and the drain terminal of the NMOS transistor.

12. An oscillator comprising:

a relaxation oscillating circuit including a first capacitor circuit generating a first oscillation voltage at a first node and a second capacitor circuit generating a second oscillation voltage at a second node, and configured to alternately output the first oscillation voltage and the second oscillation voltage through an output line coupled to an output node; and a voltage averaging feedback circuit configured to receive a reference voltage and one of the first oscillation voltage and the second oscillation voltage and to output a control voltage through an output terminal, wherein the relaxation oscillating circuit includes a leakage current compensation circuit coupled to the output line and configured to provide a leakage compensation current to the output node.

13. The oscillator of claim 12,
wherein the first capacitor circuit includes:
a first current source coupled to a supply voltage terminal to which a supply voltage is applied;
a first MOS transistor coupled to the first current source and the first node;
a first capacitor between the first node and a ground voltage terminal to which a ground voltage is applied; and
a second MOS transistor coupled to the first capacitor in parallel between the first node and the ground voltage terminal, and
wherein the second capacitor circuit includes:
a second current source coupled to the supply voltage terminal;
a third MOS transistor coupled to the second current source and the second node;
a second capacitor between the third MOS transistor and the ground voltage terminal; and
a fourth MOS transistor coupled to the second capacitor in parallel between the second node and the ground voltage terminal.

14. The oscillator of claim 13,
wherein the relaxation oscillating circuit further includes:
a first switching device coupled to the first node and the output node; and
a second switching device coupled to the second node and the output node, and
wherein the first switching device and the second switching device perform switching operations so that the first oscillation voltage and the second oscillation voltage are alternately output through the output line coupled to the output node.

15. The oscillator of claim 14,
wherein the relaxation oscillating circuit further includes:
a first comparator configured to compare the control voltage and the first oscillation voltage at the first node to output a first comparison signal;
a second comparator configured to compare the control voltage and the second oscillation voltage at the second node to output a second comparison signal; and
a latch circuit configured to receive the first comparison signal and the second comparison signal to output a first latch signal and a second latch signal for alternately turning on the first switching device and the second switching device.

16. The oscillator of claim 15,
wherein the first switching device is a first transmission gate including a first P-channel type MOS (PMOS) transistor and a first N-channel type MOS (NMOS) transistor, and
wherein the second switching device is a second transmission gate including a second PMOS transistor and a second NMOS transistor.

17. The oscillator of claim 16,
wherein a gate terminal of the first PMOS transistor receives the first latch signal,
wherein a gate terminal of the first NMOS transistor receives an inverted signal of the first latch signal,
wherein a gate terminal of the second PMOS transistor receives the second latch signal, and
wherein a gate terminal of the second NMOS transistor receives an inverted signal of the second latch signal.

18. The oscillator of claim 16, wherein each of the first PMOS transistor, the first NMOS transistor, the second PMOS transistor, and the second NMOS transistor has low voltage threshold (LVT) characteristics or ultra-high voltage threshold (ULVT) characteristics.

19. The oscillator of claim 12,
wherein the leakage current compensation circuit includes an N-channel type MOS (NMOS) transistor coupled to a supply voltage terminal and the output line, and
wherein a drain terminal of the NMOS transistor is coupled to the supply voltage terminal, and a gate terminal and a source terminal of the NMOS transistor are coupled to the output line.

20. The oscillator of claim 19, wherein the leakage current compensation circuit further includes a resistor coupled to the supply voltage terminal and the drain terminal of the NMOS transistor.

21. The oscillator of claim 12,
wherein the leakage current compensation circuit includes an N-channel type MOS (NMOS) transistor coupled to the output terminal of the voltage averaging feedback circuit and the output line, and
wherein a drain terminal of the NMOS transistor is coupled to the output terminal of the voltage averaging feedback circuit, and a gate terminal and a source terminal of the NMOS transistor are coupled to the output line.

22. The oscillator of claim 21, wherein the leakage current compensation circuit further includes a resistor coupled to the output terminal of the voltage averaging feedback circuit and the drain terminal of the NMOS transistor.

23. An oscillator comprising:
a relaxation oscillating circuit including a first resistor-capacitor (RC) circuit generating a first oscillation voltage at a first node and a second RC circuit generating a second oscillation voltage at a second node, and configured to alternately output the first oscillation voltage and the second oscillation voltage through an output line coupled to an output node; and
a voltage averaging feedback circuit configured to receive a reference voltage and one of the first oscillation voltage and the second oscillation voltage and to output a control voltage through an output terminal,
wherein the relaxation oscillating circuit includes a leakage current compensation circuit coupled to the output line and configured to counteract a leakage current from the output node.

24. The oscillator of claim 23,
wherein the first RC circuit includes:
a first MOS transistor coupled to a ground voltage terminal to which a ground voltage is applied;
a first resistor coupled to the first MOS transistor and the first node;
a first capacitor between the first node and a supply voltage terminal to which a supply voltage is applied; and
a second MOS transistor coupled to the first capacitor in parallel between the first node and the supply voltage terminal, and
wherein the second RC circuit includes:
a third MOS transistor coupled to the ground voltage terminal;
a second resistor coupled to the third MOS transistor and the second node;
a second capacitor between the second node and the supply voltage terminal; and
a fourth MOS transistor coupled to the second capacitor in parallel between the second node and the supply voltage terminal.

25. The oscillator of claim 24, wherein the first RC circuit further includes a fifth MOS transistor coupled to the first MOS transistor in parallel between the ground voltage terminal and the first node, and wherein the second RC circuit further includes a sixth MOS transistor coupled to the third MOS transistor in parallel between the ground voltage terminal and the second node.

26. The oscillator of claim 25, wherein a temperature compensation voltage generated through a temperature compensation process is applied to a gate terminal of the fifth MOS transistor and a gate terminal of the sixth MOS transistor.

27. The oscillator of claim 25, wherein the relaxation oscillating circuit further includes:

a first switching device coupled to the first node and the output node; and a second switching device coupled to the second node and the output node, and wherein the first switching device and the second switching device perform switching operations so that the first oscillation voltage and the second oscillation voltage are alternately output through the output line coupled to the output node.

28. The oscillator of claim 27, wherein the relaxation oscillating circuit further includes:

a first comparator configured to compare the control voltage and the first oscillation voltage at the first node to output a first comparison signal;

a second comparator configured to compare the control voltage and the second oscillation voltage at the second node to output a second comparison signal; and a latch circuit configured to receive the first comparison signal and the second comparison signal to output a first latch signal and a second latch signal for alternately turning on the first switching device and the second switching device.

29. The oscillator of claim 28, wherein the first switching device is a first transmission gate including a first P-channel type MOS (PMOS) transistor and a first N-channel type MOS (NMOS) transistor, and wherein the second switching device is a second transmission gate including a second PMOS transistor and a second NMOS transistor.

30. The oscillator of claim 29, wherein a gate terminal of the first PMOS transistor receives the first latch signal, wherein a gate terminal of the first NMOS transistor receives an inverted signal of the first latch signal, wherein a gate terminal of the second PMOS transistor receives the second latch signal, and wherein a gate terminal of the second NMOS transistor receives an inverted signal of the second latch signal.

31. The oscillator of claim 29, wherein each of the first PMOS transistor, the first NMOS transistor, the second PMOS transistor, and the second NMOS transistor has low voltage threshold (LVT) characteristics or ultra-high voltage threshold (ULVT) characteristics.

32. The oscillator of claim 23, wherein the leakage current compensation circuit includes a P-channel type MOS (PMOS) transistor coupled to the output terminal of the voltage averaging feedback circuit and the output line, and wherein a drain terminal of the PMOS transistor is coupled to the output terminal of the voltage averaging feedback circuit, and a gate terminal and a source terminal of the PMOS transistor are coupled to the output line.

33. The oscillator of claim 32, wherein the leakage current compensation circuit further includes a resistor coupled to the output terminal of the voltage averaging feedback circuit and the drain terminal of the PMOS transistor.

* * * * *